under 35
United States Patent
Kubo

(10) Patent No.: US 11,127,850 B2
(45) Date of Patent: Sep. 21, 2021

(54) SEMICONDUCTOR DEVICE

(71) Applicant: ROHM CO., LTD., Kyoto (JP)

(72) Inventor: Yusuke Kubo, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 378 days.

(21) Appl. No.: 15/879,753

(22) Filed: Jan. 25, 2018

(65) Prior Publication Data

US 2018/0219092 A1    Aug. 2, 2018

(30) Foreign Application Priority Data

Jan. 27, 2017 (JP) .............................. JP2017-013381

(51) Int. Cl.
*H01L 29/76* (2006.01)
*H01L 29/78* (2006.01)
(Continued)

(52) U.S. Cl.
CPC .... *H01L 29/7811* (2013.01); *H01L 21/02532* (2013.01); *H01L 21/26513* (2013.01);
(Continued)

(58) Field of Classification Search
CPC ... H01L 21/025; H01L 21/265; H01L 21/282; H01L 21/324; H01L 29/0634;
(Continued)

(56) References Cited

U.S. PATENT DOCUMENTS

2007/0029543 A1* 2/2007 Ninomiya ........... H01L 29/0634
257/25
2011/0147829 A1    6/2011 Nakajima
(Continued)

FOREIGN PATENT DOCUMENTS

JP    H1084073    3/1998
JP    2003273355    9/2003
(Continued)

OTHER PUBLICATIONS

Office Action issued for Japanese Patent Application No. 2017-013381, dated Nov. 12, 2020, 14 pages including English translation.

*Primary Examiner* — Samuel A Gebremariam
(74) *Attorney, Agent, or Firm* — Hamre, Schumann, Mueller & Larson, P.C.

(57) ABSTRACT

A semiconductor device includes a first conductivity type semiconductor layer including an active cell portion and an outer peripheral portion around the active cell portion, a second conductivity type body region selectively formed at a surface portion of the semiconductor layer in the active cell portion, a first conductivity type source region formed at an inner part of the body region, a gate electrode that faces a part of the body region through a gate insulating film, a second conductivity type column layer straddling a boundary between the active cell portion and the outer peripheral portion inside the semiconductor layer such that the column layer is disposed at a lower part of the body region in the active cell portion, a source electrode that is electrically connected to the source region, and an outer peripheral electrode that is electrically connected to the column layer in the outer peripheral portion.

12 Claims, 21 Drawing Sheets

(51) Int. Cl.
- *H01L 29/10* (2006.01)
- *H01L 29/08* (2006.01)
- *H01L 29/06* (2006.01)
- *H01L 29/423* (2006.01)
- *H01L 21/265* (2006.01)
- *H03K 17/16* (2006.01)
- *H01L 29/66* (2006.01)
- *H01L 21/02* (2006.01)
- *H01L 21/324* (2006.01)
- *H01L 21/28* (2006.01)
- *H01L 29/40* (2006.01)
- *H01L 21/3065* (2006.01)
- *H01L 29/36* (2006.01)

(52) U.S. Cl.
CPC ...... *H01L 21/28211* (2013.01); *H01L 21/324* (2013.01); *H01L 29/0615* (2013.01); *H01L 29/0619* (2013.01); *H01L 29/0634* (2013.01); *H01L 29/0649* (2013.01); *H01L 29/0657* (2013.01); *H01L 29/0696* (2013.01); *H01L 29/0865* (2013.01); *H01L 29/1095* (2013.01); *H01L 29/402* (2013.01); *H01L 29/4238* (2013.01); *H01L 29/42376* (2013.01); *H01L 29/66712* (2013.01); *H03K 17/161* (2013.01); *H01L 21/02236* (2013.01); *H01L 21/02255* (2013.01); *H01L 21/30655* (2013.01); *H01L 29/0878* (2013.01); *H01L 29/36* (2013.01)

(58) Field of Classification Search
CPC ............. H01L 29/0657; H01L 29/0696; H01L 29/0865; H01L 29/7811
USPC .................................. 257/324–336
See application file for complete search history.

(56) References Cited

U.S. PATENT DOCUMENTS

2014/0287559 A1* 9/2014 Nakajima ........... H01L 29/0696
438/138
2014/0306283 A1* 10/2014 Nakajima ........... H01L 29/7827
257/329

FOREIGN PATENT DOCUMENTS

| | | |
|---|---|---|
| JP | 2008117826 | 5/2008 |
| JP | 2009004668 | 1/2009 |
| JP | 2009141307 | 6/2009 |
| JP | 2016111129 | 6/2016 |
| WO | 2010024433 A1 | 3/2010 |

* cited by examiner

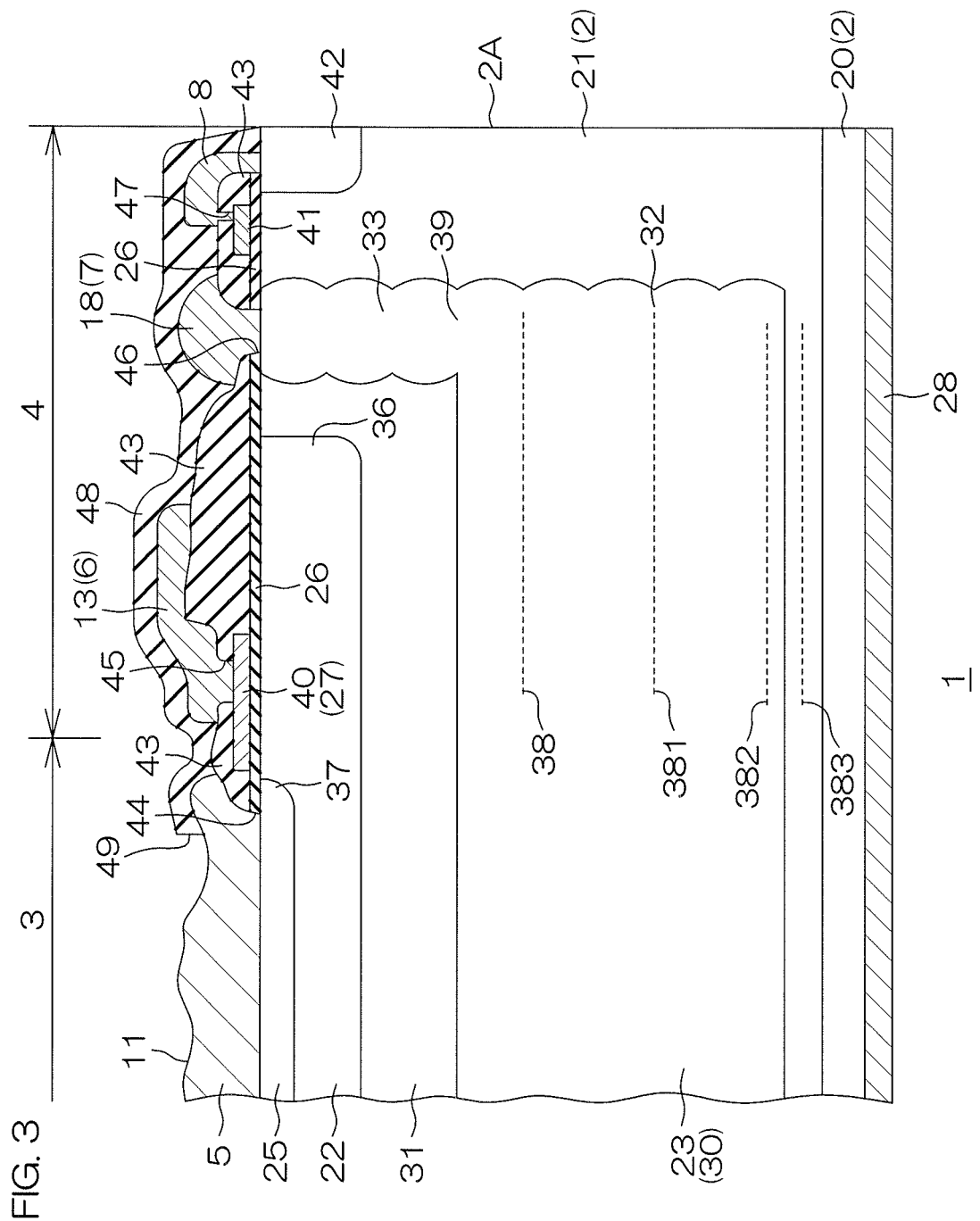

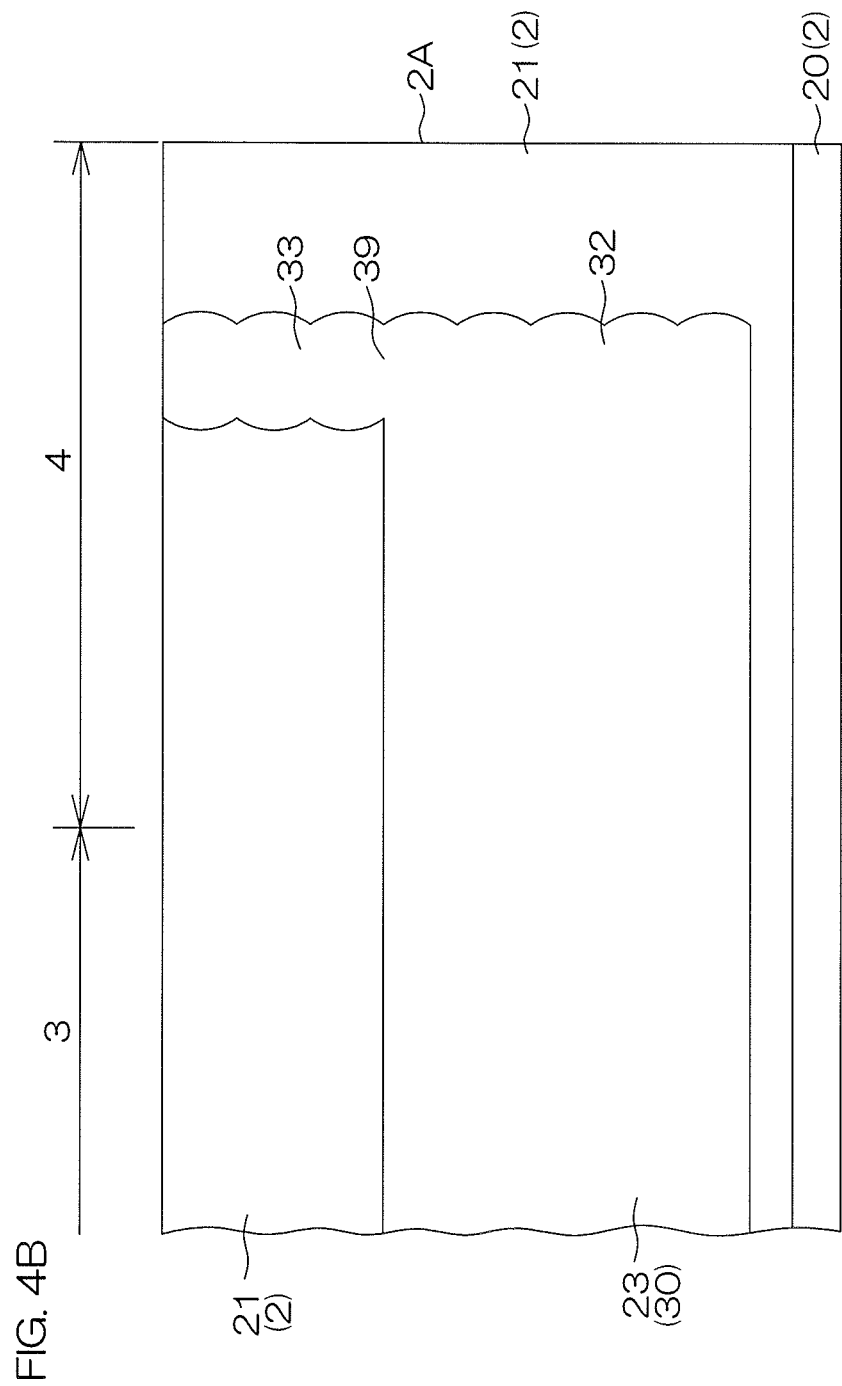

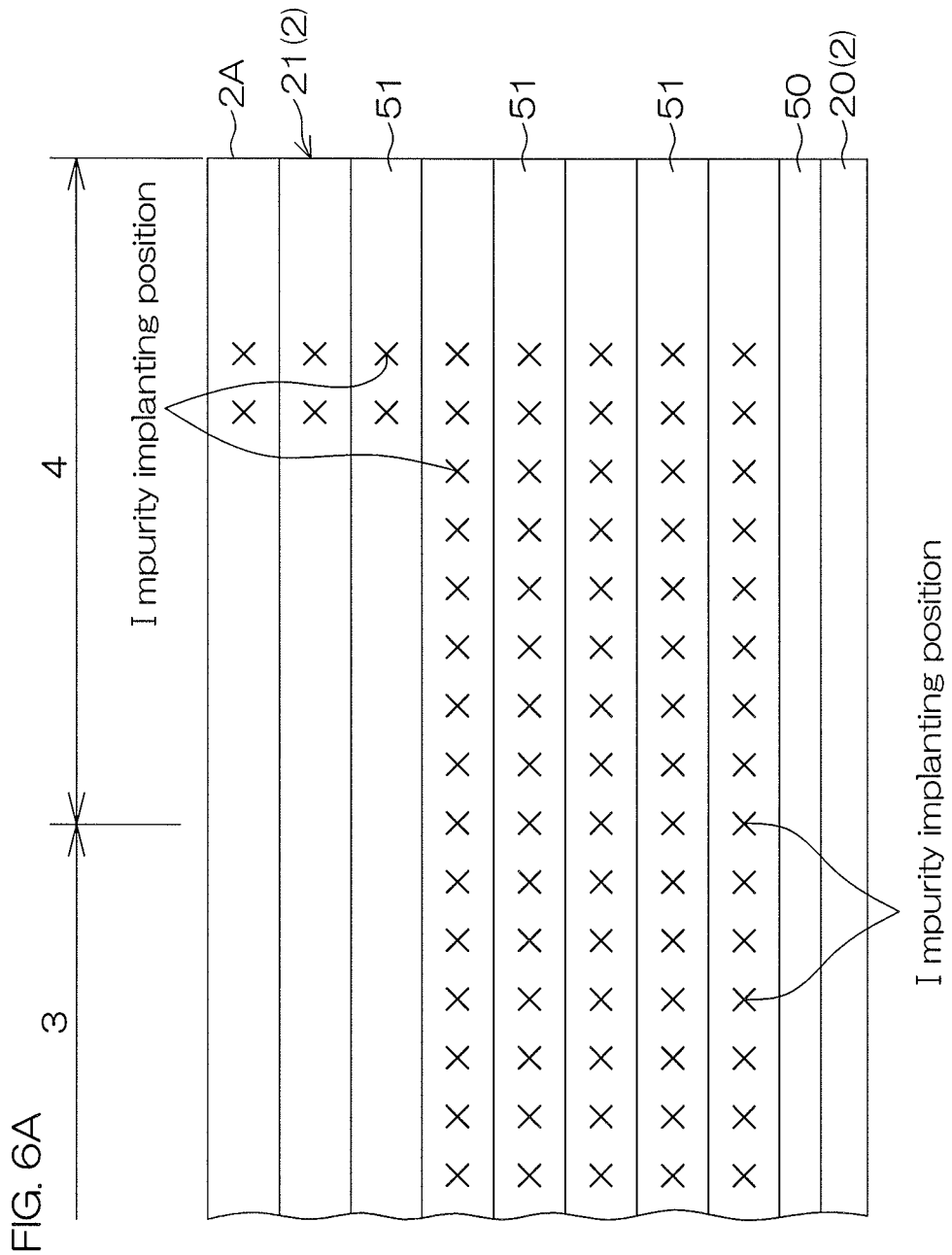

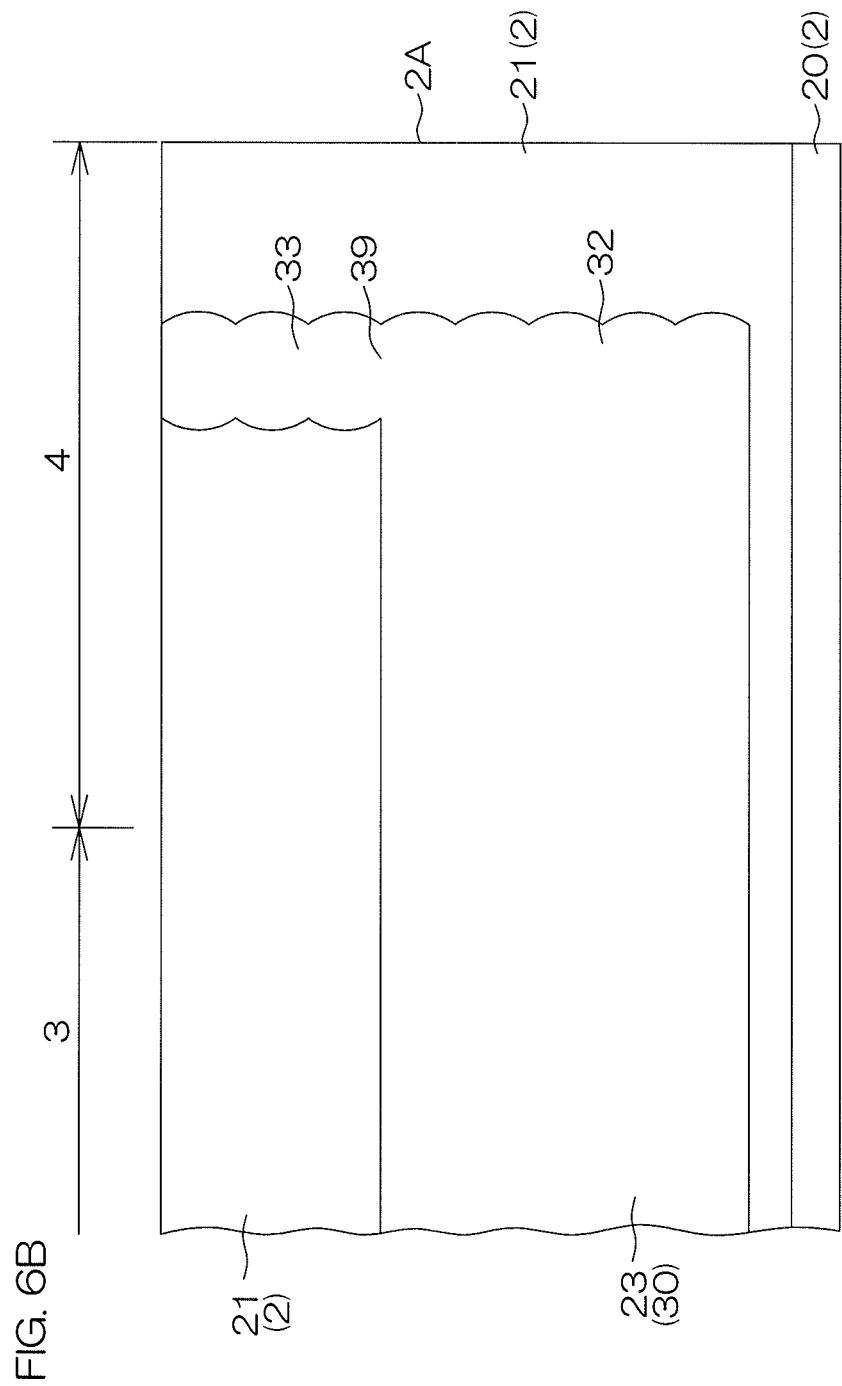

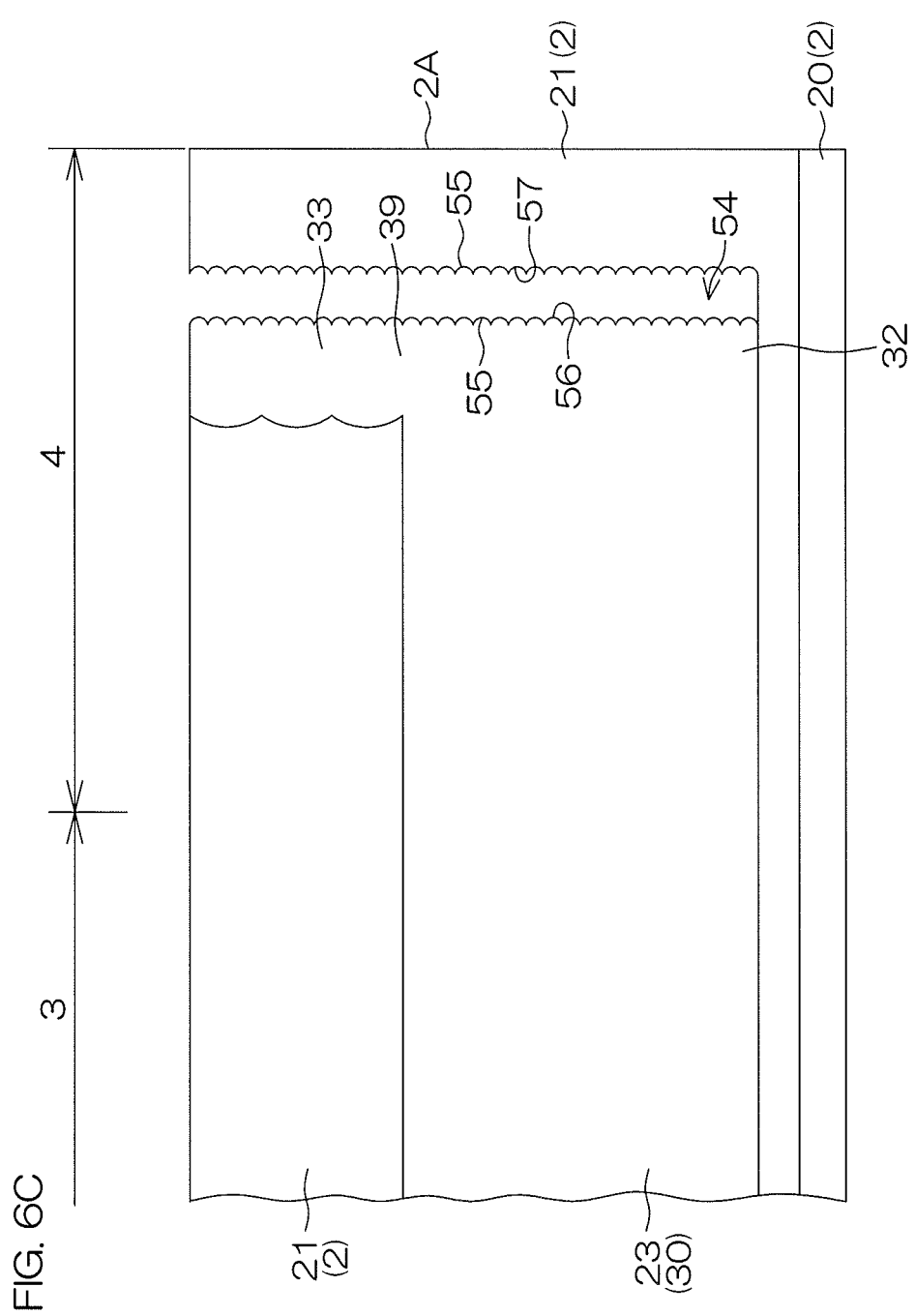

SEMICONDUCTOR DEVICE

CROSS-REFERENCE TO RELATED APPLICATIONS

The present application corresponds to Japanese Patent Application No. 2017-13381 filed with the Japan Patent Office on Jan. 27, 2017, and the entire disclosure of the application is incorporated herein by reference.

TECHNICAL FIELD

The present invention relates to a semiconductor device that has a superjunction structure.

BACKGROUND ART

Patent Document 1 (PCT International Application Publication No. 2010/024433) discloses a semiconductor device that includes a first base layer, a drain layer disposed at a rear surface of the first base layer, a second base layer formed at a front surface of the first base layer, a source layer formed at a front surface of the second base layer, a gate insulating film disposed on a front surface of the source layer and on the front surface of the second base layer, a gate electrode disposed on the gate insulating film, a column layer formed so as to face the drain layer in the first base layer under the second base layer and the source layer, a drain electrode disposed at the drain layer, and a source electrode disposed at the source layer and at the second base layer, in which the column layer is subjected to heavy-particle irradiation, so that a trap level is locally formed.

SUMMARY OF INVENTION

According to the invention of Patent Document 1, carriers are trapped by the trap level formed below the column layer. The reverse recovery time trr of the semiconductor device is intended to be shortened by the trapping, and yet there is still scope for improvement. For example, although a trap level is formed in a region directly under the column layer in the invention of Patent Document 1, it is possible to recombine even more carriers together at a trap level if a region in which many carriers are distributed when the semiconductor device is turned off is ascertained and if the trap level is formed in this region.

An object of the present invention is to provide a semiconductor device that is capable of controlling electric characteristics so that an electric current preferentially flows to an outer peripheral portion when the semiconductor device is turned off.

Another object of the present invention is to provide a semiconductor device that is capable of making a reverse recovery time trr shorter than in the past.

BRIEF DESCRIPTION OF DRAWINGS

FIG. 3 is a cross-sectional view that appears when the semiconductor device is cut along line of FIG. 1.

FIG. 4A to FIG. 4D are views showing a manufacturing process of the semiconductor device of FIG. 3.

FIG. 6A to FIG. 6E are views showing a manufacturing process of the semiconductor device of FIG. 5.

DESCRIPTION OF EMBODIMENTS

Figure 1:
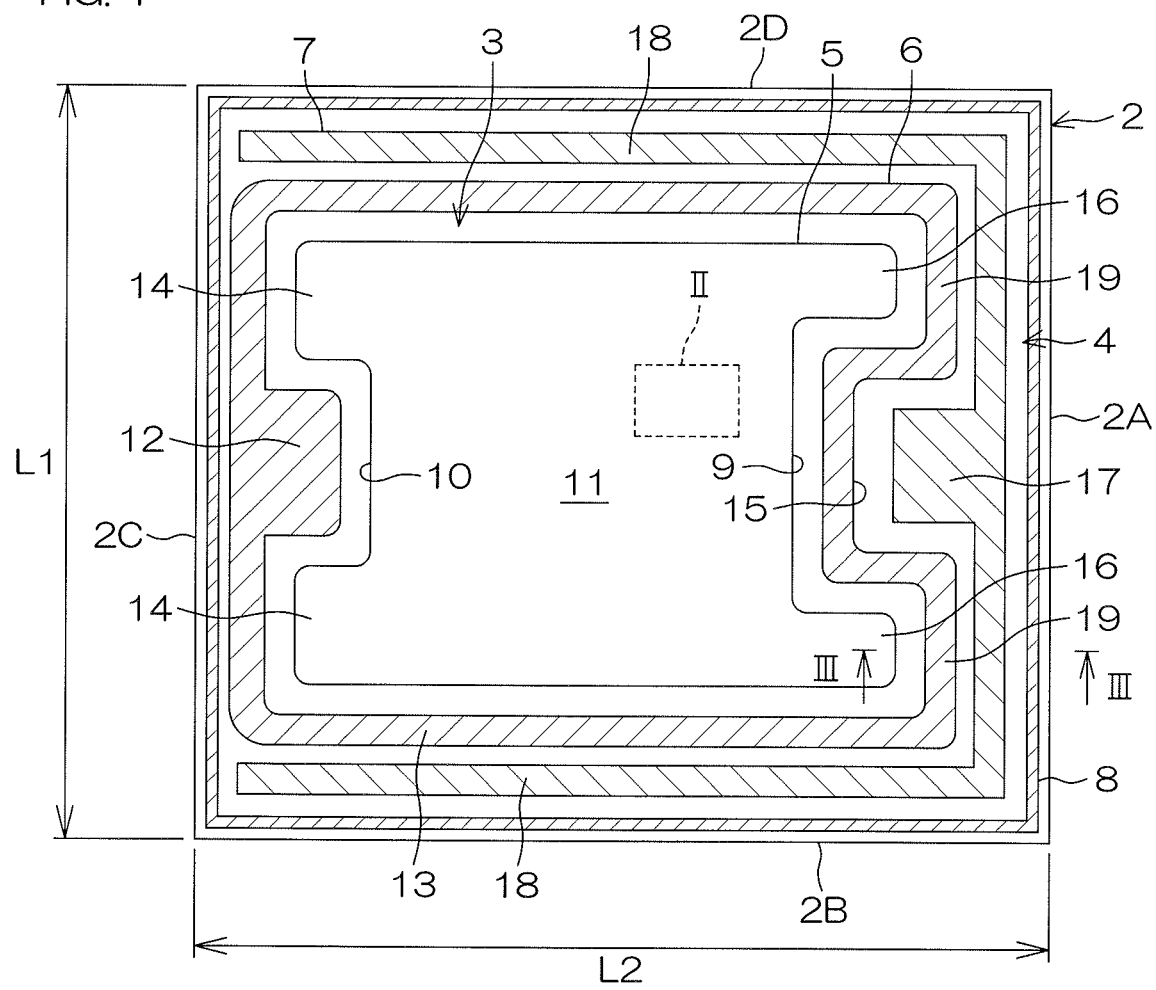
FIG. 1 is a schematic plan view of a semiconductor device according to a preferred embodiment of the present invention.

A semiconductor device according to a preferred embodiment of the present invention includes a first conductivity type semiconductor layer including an active cell portion and an outer peripheral portion around the active cell portion, a second conductivity type body region selectively formed at a surface portion of the semiconductor layer in the active cell portion, a first conductivity type source region formed at an inner part of the body region, a gate electrode that faces a part of the body region through a gate insulating film, a second conductivity type column layer straddling a boundary between the active cell portion and the outer peripheral portion inside the semiconductor layer such that the column layer is disposed at a lower part of the body region in the active cell portion, a source electrode that is electrically connected to the source region, and an outer peripheral electrode that is electrically connected to the column layer in the outer peripheral portion.

According to this arrangement, in the outer peripheral portion, the column layer is connected to the outer peripheral electrode that is independent of the source electrode. This makes it possible to allow an electric current to preferentially flow to the outer peripheral portion by applying an appropriate voltage to the outer peripheral electrode when the semiconductor device is turned off. Although, normally, a reverse current flows to the source-drain path of the active cell portion by turning off the semiconductor device, it is possible to control the current so that a part of or all of the current flows to the outer peripheral portion. Therefore, it is possible to distribute even more carriers moving through the semiconductor layer in the outer peripheral portion than in the active cell portion when the semiconductor device is turned off.

Therefore, preferably, the semiconductor device according to the preferred embodiment of the present invention additionally includes a carrier obstructing portion being in contact with the column layer in the outer peripheral portion. The carrier obstructing portion may be capable of trapping and reducing carriers in the column layer.

According to this arrangement, the carrier obstructing portion is formed in the outer peripheral portion in which many carriers are distributed, and therefore it is possible to facilitate a recombination of carriers. As a result, it is possible to make a reverse recovery time trr shorter than before.

In the semiconductor device according to the preferred embodiment of the present invention, the carrier obstructing portion may include a trap level region disposed in the semiconductor layer. In this case, the trap level region may include heavy particles that include any one of protons, $^3\text{He}^{++}$, and $^4\text{He}^{++}$.

If the semiconductor device according to the preferred embodiment of the present invention additionally includes a deep trench that is formed adjacently to the column layer and that has a side surface from which the column layer is exposed, the carrier obstructing portion may include a minute concavo-convex portion formed at an exposed part of the column layer in the side surface of the deep trench. In this case, the semiconductor device according to the preferred embodiment of the present invention may additionally include an embedded insulating film that is formed in the deep trench.

In the semiconductor device according to the preferred embodiment of the present invention, the column layer may include a separated column separated from the body region in the active cell portion.

In the semiconductor device according to the preferred embodiment of the present invention, the column layer may include a continuous column that is continuously formed downwardly from the body region in the active cell portion.

In the semiconductor device according to the preferred embodiment of the present invention, the body region may include a plurality of body regions that extend in a stripe shape with intervals from each other.

If the semiconductor device according to the preferred embodiment of the present invention additionally includes a gate finger that surrounds the source electrode, the outer peripheral electrode may surround the gate finger.

If the semiconductor device according to the preferred embodiment of the present invention additionally includes a contact layer that extends from the column layer toward a front surface side of the semiconductor layer in the outer peripheral portion and that is formed of a semiconductor impurity region exposed to a front surface of the semiconductor layer, the outer peripheral electrode may be connected to the contact layer in the front surface of the semiconductor layer.

If the semiconductor device according to the preferred embodiment of the present invention additionally includes an embedded contact member that is embedded from a front surface of the semiconductor layer to a depth position below the body region in the outer peripheral portion and that is connected to the column layer at the depth position, the outer peripheral electrode may be connected to the embedded contact member in the front surface of the semiconductor layer.

In the semiconductor device according to the preferred embodiment of the present invention, the semiconductor layer may include a silicon substrate.

Preferred embodiments of the present invention will be hereinafter described in detail with reference to the accompanying drawings.

FIG. 1 is a schematic plan view of a semiconductor device 1 according to a preferred embodiment of the present invention. For clarification, electrode films 5 to 8 are shown by hatching in FIG. 1.

The semiconductor device 1 includes a semiconductor substrate 2 formed in a quadrangular shape in a plan view. A length L1 in a first direction of the semiconductor substrate 2 (i.e., length along side surfaces 2A and 2C of the semiconductor substrate 2 in FIG. 1) may be, for example, 1.0 mm to 9.0 mm, and a length L2 in a second direction perpendicular to the first direction (i.e., length along side surfaces 2B and 2D of the semiconductor substrate 2 in FIG. 1) may be, for example, 1.0 mm to 9.0 mm.

The semiconductor substrate 2 includes an active cell portion 3 in its central area in a plan view. The active cell portion 3 is a region in which a unit cell 29 described later is chiefly formed, and is a region in which an electric current flows in the thickness direction of the semiconductor substrate 2 when a source-drain path of the semiconductor device 1 is in an electrically conductive state (when turned on). The semiconductor substrate 2 additionally includes an outer peripheral portion 4 around the active cell portion 3.

The semiconductor device 1 includes a source electrode film 5 formed on the active cell portion 3 and a gate electrode film 6, an outer peripheral electrode film 7, and an equipotential ring film 8 that are formed on the outer peripheral portion 4. These electrode films are separated from each other by the patterning of a shared electrode film.

The source electrode film 5 is formed in a substantially quadrangular shape in a plan view such that a greater part of the active cell portion 3 is covered therewith. For-pad concave portions 9 and 10 that are used for pads and that are concaved inwardly into the source electrode film 5 are respectively formed at a pair of side portions facing each other of the source electrode film 5 (in FIG. 1, aside portion closer to a side surface 2A of the semiconductor substrate 2 and a side portion closer to a side surface 2C thereof). The for-pad concave portions 9 and 10 are respectively disposed to effectively secure a disposition space for an outer peripheral pad 17 and a gate pad 12 described later. In comparison between the for-pad concave portions 9 and 10, the concave portion 9 for the outer peripheral pad 17 is formed more widely than the concave portion 10 for the gate pad 12. The source electrode film 5 is selectively covered with a surface protection film 48 (see FIG. 3), and its part is exposed to serve as a source pad 11. A joint member, such as a bonding wire, is connected to the source pad 11.

The gate electrode film 6 includes the gate pad 12 and a gate finger 13.

The gate pad 12 is a part of the gate electrode film 6 covered with the surface protection film 48 (see FIG. 3), and this part is selectively exposed from the surface protection film 48. A joint member, such as a bonding wire, is connected to the gate pad 12. The gate pad 12 is selectively disposed on the side of one of a pair of side surfaces (the side surface 2A and the side surface 2C in FIG. 1) that face each other of the semiconductor substrate 2. In the present preferred embodiment, the gate pad 12 is disposed such that the gate pad 12 overlaps with an inner region of the for-pad concave portion 10 in a plan view, and is interposed with intervals between a pair of projecting portions 14 and 14 of the source electrode film 5 that partition side portions of the for-pad concave portion 10 from both sides.

The gate finger 13 is formed linearly along the side surfaces 2A to 2D of the semiconductor substrate 2 from the gate pad 12. In the present preferred embodiment, the gate finger 13 is formed in a closed ring shape that surrounds the source electrode film 5. A part (part closer to the side surface 2A of the semiconductor substrate 2) of the gate finger 13 that faces the gate pad 12 is formed such that one side and the other side in its width direction extend along the for-pad concave portion 9 in a plan view. Consequently, a finger concave portion 15 partitioned by a part of the gate finger 13 is formed at the for-pad concave portion 9. In the present preferred embodiment, the finger concave portion 15 is interposed with intervals between a pair of projecting portions 16 and 16 of the source electrode film 5 that partition side portions of the for-pad concave portion 9 from both sides in a plan view. The gate finger 13 is not necessarily required to be formed in a closed ring shape, and it may be formed in a shape whose part is opened. For example, the gate finger 13 may be formed in a shape, in which a side opposite to the gate pad 12 is opened, following an outer peripheral finger 18 described later. Additionally, the gate finger 13 is covered with the surface protection film 48 (see FIG. 3).

The outer peripheral electrode film 7 includes the outer peripheral pad 17 and the outer peripheral finger 18.

The outer peripheral pad 17 is a part of the outer peripheral electrode film 7 covered with the surface protection film 48 (see FIG. 3), and this part is selectively exposed from the surface protection film 48. A joint member, such as a bonding wire, is connected to the outer peripheral pad 17. The outer peripheral pad 17 is selectively disposed on the side of one of the pair of side surfaces (the side surface 2A and the side surface 2C in FIG. 1) that face each other of the semiconductor substrate 2. In the present preferred embodiment, the outer peripheral pad 17 is disposed on the side opposite to the gate pad 12 in a plan view, and is provided such that the outer peripheral pad 17 overlaps with an inner region of the finger concave portion 15. Consequently, the outer peripheral pad 17 is interposed with intervals between a pair of projecting portions 19 and 19 of the gate finger 13 that partition side portions of the finger concave portion 15 from both sides. Unlike the relationship between the gate pad 12 and the for-pad concave portion 10, the outer peripheral pad 17 is not disposed such that the outer peripheral pad 17 overlaps with an inner region of the for-pad concave portion 9 in FIG. 1. However, for example, in a mode in which the for-pad concave-portion-9 side of the gate finger 13 is opened, the for-pad concave portion 9 may be substantially equal in width to the for-pad concave portion 10, and the outer peripheral pad 17 may be overlapped with the inner region of the for-pad concave portion 9.

The outer peripheral finger 18 is formed linearly along side surfaces of the semiconductor substrate 2 (in FIG. 1, side surfaces 2A, 2B, and 2D) from the outer peripheral pad 17. In the present preferred embodiment, the outer peripheral finger 18 is formed in a shape that surrounds the source electrode film 5 and the gate electrode film 6 and in which a side opposite to the outer peripheral pad 17 is opened. The outer peripheral finger 18 may be formed in a closed ring shape that completely surrounds the source electrode film 5 and the gate electrode film 6. Additionally, the outer peripheral finger 18 may be equal in width to the gate finger 13 and may be disposed in parallel to the gate finger 13 with an interval therebetween. The outer peripheral finger 18 is covered with the surface protection film 48 (see FIG. 3).

The equipotential ring film 8 is formed in a closed ring shape that surrounds the source electrode film 5, the gate electrode film 6, and the outer peripheral electrode film 7. The equipotential ring film 8 may be formed such that the equipotential ring film 8 is smaller in width than the gate finger 13 and than the outer peripheral finger 18. The equipotential ring film 8 is covered with the surface protection film 48 (see FIG. 3).

Figure 2:
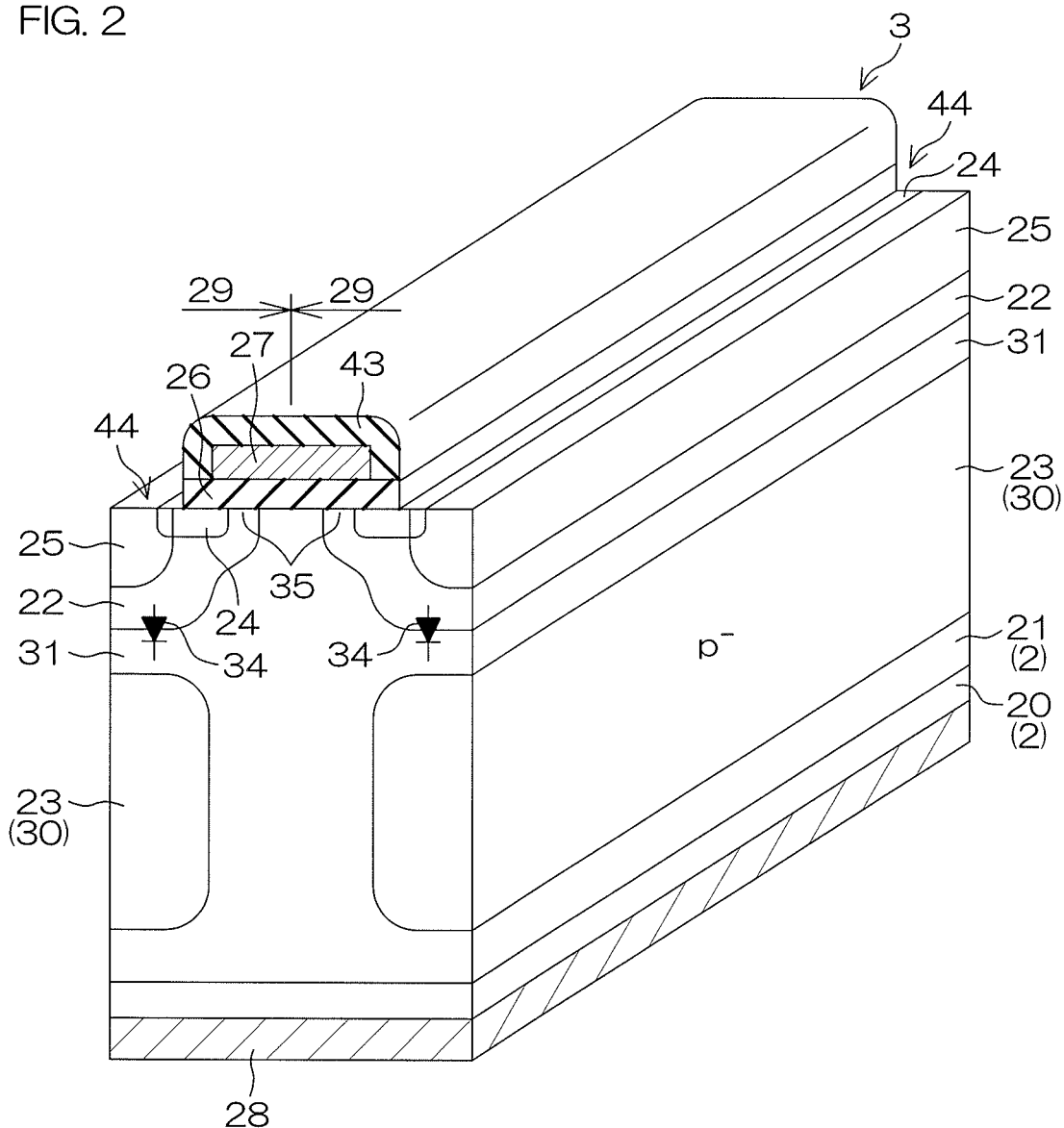
FIG. 2 is a perspective cross-sectional view of a part surrounded by a broken line II of the semiconductor device of FIG. 1.

FIG. 2 is a perspective cross-sectional view of a part surrounded by a broken line II of the semiconductor device 1 of FIG. 1. FIG. 3 is a cross-sectional view that appears when the semiconductor device 1 is cut along line of FIG. 1. In FIG. 2, an arrangement on an interlayer insulating film 43 is excluded.

The semiconductor device 1 is an n channel type MOS-FET (Metal Oxide Semiconductor Field Effect Transistor) that has a superjunction structure.

The semiconductor device 1 includes an $n^+$ type drain layer 20, an n type base layer 21, a p type body region 22, a $p^-$ type column layer 23, an $n^+$ type source region 24, a $p^+$ type body contact region 25, a gate insulating film 26, a gate electrode 27, and a drain electrode 28. The semiconductor substrate 2 of FIG. 1 may have a concept in which the $n^+$ type drain layer 20 and the $n^-$ type base layer 21 are combined together.

The $n^+$ type drain layer 20 may be formed of an $n^+$ type semiconductor substrate (for example, silicon substrate). Besides, it may be a substrate, such as a SiC substrate or a GaN substrate, that is generally employed in a transistor. The $n^+$ type semiconductor substrate may be a semiconductor substrate that is subjected to crystal growth while being doped with an n type impurity. P (phosphorus), As (arsenic), and SB (antimony), etc., are applicable as the n type impurity. The impurity concentration of the $n^+$ type drain layer 20 is, for example, about $1.0 \times 10^{18}$ cm$^{-3}$ to $5.0 \times 10^{20}$ cm$^{-3}$.

The $n^-$ type base layer 21 is a semiconductor layer into which an n type impurity is implanted. More specifically, it may be an n type epitaxial layer that is epitaxially grown while implanting an n type impurity on the $n^+$ type drain layer 20. The aforementioned one is applicable as the n type impurity. The impurity concentration of the $n^-$ type base layer 21 is lower than that of the $n^+$ type drain layer 20, and is, for example, about $1.0 \times 10^{10}$ cm$^{-3}$ to $1.0 \times 10^{16}$ cm$^{-3}$.

The p type body region 22 is a semiconductor layer into which a p type impurity is implanted. More specifically, it may be a semiconductor layer formed by performing the ion implantation (or, simply, implantation) of a p type impurity into the n type base layer 21. B (boron), Al (aluminum), Ga (gallium), etc., are applicable as the p type impurity. The impurity concentration of the p type body region 22 is, for example, about $1.0 \times 10^{15}$ cm$^{-3}$ to $1.0 \times 10^{19}$ cm$^{-3}$.

The p type body region 22 is selectively formed at a surface portion of the $n^-$ type base layer 21. In the present preferred embodiment, as shown in FIG. 2, the plurality of p type body regions 22 are parallel to each other in a stripe shape, and extend in a direction, for example, along the side surfaces 2B and 2D of the semiconductor substrate 2 (see FIG. 1). The plurality of p type body regions 22 may be arranged in a matrix manner in the surface portion of the $n^-$ type base layer 21. The width of each of the p type body regions 22 is, for example, 3 µm to 10 µm. A region including each of the p type body regions 22 and the $n^-$ type base layer 21 therearound forms a unit cell 29. In other words, the semiconductor device 1 has many (a plurality of) unit cells 29 arranged in a striped manner in a plan view in the layout of FIG. 2.

Additionally, each of the p type body regions 22 straddles a boundary between the active cell portion 3 and the outer peripheral portion 4 as shown in FIG. 3. An end portion 36 in the outer peripheral portion 4 of each of the p type body regions 22 is disposed at a position with an interval inwardly with respect to the side surface 2A of the semiconductor substrate 2, and a region between the end portion 36 and the side surface 2A is a region of the n⁻ type base layer 21. Additionally, each of the p type body regions 22 forms a parasitic diode (body diode) 34 at an interface (pn junction surface) with the n⁻ type base layer 21 as shown in FIG. 2.

The p⁻ type column layer 23 may be a semiconductor layer formed by performing the ion implantation (or, simply, implantation) of a p type impurity into the n⁻ type base layer 21. The aforementioned one is applicable as the p type impurity. The impurity concentration of the p⁻ type column layer 23 is lower than that of the type body region 22, and is, for example, about $1.0\times10^{15}$ cm⁻³ to $1.0\times10^{19}$ cm⁻³.

As shown in FIG. 2, the p⁻ type column layer 23 is formed in an inner region of the p type body region 22 of each of the unit cells 29. More specifically, the p type column layer 23 is formed in a stripe shape in a region of the center in the width direction of the p type body region 22.

In the present preferred embodiment, the p⁻ type column layer 23 includes a separated column 30 formed with an interval below the p type body region 22 in the active cell portion 3. Consequently, an n⁻ type interrupting region 31 formed of a part of the n⁻ type base layer 21 is formed between the p type body region 22 and the separated column 30. The interval of the interrupting region 31 (i.e., distance between a lower end of the p type body region 22 and an upper end of the separated column 30) may be, for example, 0.5 μm to 5.0 μm.

As shown in FIG. 3, the p⁻ type column layer 23 straddles a boundary between the active cell portion 3 and the outer peripheral portion 4 in a lower part of the p type body region 22. Consequently, the p⁻ type column layer 23 additionally includes, in the outer peripheral portion 4, a drawn portion 32 that is formed of an extension portion of the separated column 30 and that is drawn outwardly from the end portion 36 in the outer peripheral portion 4 of the p type body region 22 (i.e., toward the side-surface-2A side).

A p⁻ type contact layer 33 that extends toward the front-surface side of the n⁻ type base layer 21 from the drawn portion 32 and that is exposed to the front surface of the n⁻ type base layer 21 is formed. The p⁻ type contact layer 33 may be a semiconductor layer formed by performing the ion implantation (or, simply, implantation) of a p type impurity into the n⁻ type base layer 21. The aforementioned one is applicable as the p type impurity. The impurity concentration of the p⁻ type contact layer 33 is, for example, about $1.0\times10^{15}$ cm⁻³ to $1.0\times10^{19}$ cm⁻³ as in the p⁻ type column layer 23.

The p⁻ type contact layer 33 extends in the thickness direction of the n type base layer 21 at a position with an interval from the end portion 36 of the p type body region 22. In other words, plainly speaking, a p type impurity region, in which the p⁻ type column layer 23 and the p⁻ type contact layer 33 are formed integrally with each other, is formed such that the p type impurity region comes around from a lateral part of the p type body region 22 from the lower part thereof in the outer peripheral portion 4. The p type impurity region is separated from the p type body region 22 by means of the n⁻ type base layer 21 in both of the lower part and the lateral part of the p type body region 22. Consequently, the p type body region 22, the n⁻ type base layer 21, and the p⁻ type contact layer 33 are aligned in this order in a direction along the front surface of the n type base layer 21, and, as a result, a pnp structure is formed.

Additionally, side surfaces extending in the depth direction of the n⁻ type base layer 21 of the p⁻ type column layer 23 and of the p⁻ type contact layer 33 are each formed as a concavo-convex surface that periodically undulates in the depth direction. Normally, the number of concaves and convexes of the concavo-convex surface is substantially equal to the number of steps of an n type semiconductor layer 51 (FIG. 4A) described later. For clarification, the p⁻ type column layer 23 from which the concavo-convex surface has been excluded is shown in FIG. 2.

As shown in FIG. 3, a trap level region 38 is formed in the outer peripheral portion 4 of the n⁻ type base layer 21. The trap level region 38 is a region formed by radiating heavy particles or electron beams from the rear-surface side of the n type base layer 21. Many recombination centers that allow carriers to disappear by being trapped and recombined together exist in the trap level region 38.

The trap level region 38 is locally formed such that the trap level region 38 spreads in a thin manner (for example, with a thickness of about 1 μm to 3 μm) at a predetermined depth position from a rear surface of the n⁺ type drain layer 20 in the n⁻ type base layer 21. For example, the trap level region 38 may be formed in an upper region of the p⁻ type column layer 23. Besides, the trap level region 38 may be replaced by a trap level region 381 formed in a central region of the p⁻ type column layer 23, by a trap level region 382 formed in a lower region of the p type column layer 23, and by a trap level region 383 formed in a part of the n⁻ type base layer 21 below the p⁻ type column layer 23. Preferably, the trap level region 38 is formed in the upper region of the p⁻ type column layer 23 from the viewpoint of efficiently trapping carriers (positive holes) flowing toward the outer peripheral electrode film 7 that is placed above the p⁻ type column layer 23, and, more preferably, the trap level region 38 is overlapped with a connection portion 39 between the p type column layer 23 (drawn portion 32) and the p type contact layer 33 as shown in FIG. 3. Carriers that flow toward the outer peripheral electrode film 7 necessarily pass through the connection portion 39, and therefore it is possible to improve the trap efficiency of carriers by forming the trap level region 38 at that position.

In order to form the trap level region 38, it is possible to apply heavy-particle irradiation that uses heavy particles, such as protons, ³He⁺⁺, or ⁴He⁺⁺, and electron-beam irradiation. Particularly, it is preferable to use a helium nucleus (³He⁺⁺ or ⁴He⁺⁺) having large mass because it is capable of narrowing a distribution region in the thickness direction of recombination centers and is capable of locally distributing recombination centers in a narrow range with respect to the thickness direction.

The n⁺ type source region 24 is formed in an inner region of the p type body region 22 of each of the unit cells 29. In this region, the n⁺ type source region 24 is selectively formed at a surface portion of the p type body region 22. The n⁺ type source region 24 may be formed by selectively applying the ion implantation of an n type impurity into the p type body region 22. Examples of the n type impurity are as mentioned above. The impurity concentration of the n⁺ type source region 24 is higher than that of the n⁻ type base layers 21, and is, for example, about $1.0\times10^{18}$ cm⁻³ to $5.0\times10^{20}$ cm⁻³.

The n⁺ type source region 24 is formed in the p type body region 22 such that the n⁺ type source region 24 is positioned at a predetermined distance inwardly from a peripheral edge of the p type body region 22 (an interface between the p type body region 22 and the n⁻ type base layer 21). Consequently, in a surface layer region of the semiconductor layer including the n⁻ type base layer 21, the p type body region 22, etc., a surface portion of the p type body region 22 is interposed between the n⁺ type source region 24 and the n⁻ type base layer 21, and the surface portion interposed therebetween provides a channel region 35.

In the present preferred embodiment, the n⁺ type source region 24 is formed in a stripe shape, and is formed in a region outside a side surface of the p⁻ type column layer 23. The channel region 35 has a stripe shape in accordance with the shape of the n⁺ type source region 24.

The p⁻ type body contact region 25 is formed in a region directly on the p⁻ type column layer 23. In this region, the p⁺ type body contact region 25 is selectively formed at the surface portion of the p type body region 22. The p⁻ type body contact region 25 may be formed by selectively applying the ion implantation of a p type impurity into the p type body region 22. Examples of the p type impurity are as mentioned above. The impurity concentration of the p⁺ type body contact region 25 is higher than that of the p type body region 22, and is, for example, about $5.0 \times 10^{17}$ cm⁻³ to $1.0 \times 10^{19}$ cm⁻³.

The p⁺ type body contact region 25 passes through the n⁺ type source region 24, and extends to a halfway position of the p type body region 22 toward the n⁺ type drain layer 20.

In the present preferred embodiment, the p⁺ type body contact region 25 is formed in a stripe shape. As shown in FIG. 3, an end portion 37 of each p⁺ type body contact region 25 is disposed in the active cell portion 3, and is disposed at a position with an interval inwardly with respect to the end portion 36 of the p type body region 22. Consequently, a region between the end portion 37 and the end portion 36 of the p type body region 22 becomes a region of the p type body region 22.

Additionally, as shown in FIG. 3, an end-surface-side p type region 42 that is exposed to an end surface (side surface of the semiconductor substrate 2) of the n⁻ type base layer 21 and to the front surface of the n⁻ type base layer 21 is formed at the surface portion of the n⁻ type base layer 21. The end-surface-side p type region 42 is formed through the same process as that of the p type body region 22, and is the same in depth as the p type body region 22. Therefore, the impurity concentration of the end-surface-side p type region 42 is the same as that of the p type body region 22, and is, for example, about $1.0 \times 10^{15}$ cm⁻³ to $1.0 \times 10^{19}$ cm⁻³.

The gate insulating film 26 may be made of, for example, a silicon oxide film, a silicon nitride film, a silicon oxynitride film, a hafnium oxide film, an alumina film, a tantalum oxide film, etc. As shown in FIG. 2, the gate insulating film 26 is formed such that the gate insulating film 26 covers, at least, a front surface of the p type body region in the channel region 35. In the present preferred embodiment, the gate insulating film 26 covers a part of the n⁺ type source region 24, the channel region 35, and the front surface of the n⁻ type base layer 21. More plainly speaking, the gate insulating film 26 is formed with a pattern that has an opening in the p⁻ type body contact region 25 of each of the unit cells 29 and in an inner-edge region of the n⁺ type source region 24 continuous with the p⁺ type body contact region 25. Additionally, as shown in FIG. 3, the gate insulating film extends from the active cell portion 3 to the outer peripheral portion 4, and is selectively formed at the outer peripheral portion 4.

The gate electrode 27 is facing the channel region 35 through the gate insulating film 26. The gate electrode 27 may be made of, for example, polysilicon that is lowered in resistance by implanting an impurity.

As shown in FIG. 2, in the active cell portion 3, the gate electrode 27 is formed such that the gate electrode 27 has substantially the same pattern as the gate insulating film 26, and covers a front surface of the gate insulating film 26. In other words, the gate electrode 27 is disposed above a part of the n⁺ type source region 24, the channel region 35, and the front surface of the n⁻ type base layer 21. More plainly speaking, the gate electrode 27 is formed with a pattern that has an opening in the p⁺ type body contact region 25 of each of the unit cells 29 and in the inner-edge region of the n⁺ type source region 24 continuous with the p⁺ type body contact region 25. In other words, the gate electrode 27 is capable of controlling the plurality of unit cells 29 in common. Consequently, a planar gate structure is configured.

On the other hand, in the outer peripheral portion 4, the gate electrode 27 has a contact portion 40 disposed at a position facing the region between the end portion 37 of the p⁺ type body contact region 25 and the end portion 36 of the p type body region 22 as shown in FIG. 3. The gate electrode film 6 (gate finger 13) that is an external electrode is connected to the contact portion 40. Additionally, in the outer peripheral portion 4, an equipotential ring electrode 41 made of the same material as that of the gate electrode 27 is disposed on the gate insulating film 26. The equipotential ring electrode 41 is disposed on a region between the p⁻ type contact layer 33 and the end-surface-side p type region 42, and is formed so as not to overlap with the p⁻ type contact layer 33 and the end-surface-side p type region 42.

An interlayer insulating film 43 is formed on the n type base layer 21 and covers the gate electrode 27 and the equipotential ring electrode 41. The interlayer insulating film 43 is made of an insulating material, such as a silicon oxide film, a silicon nitride film, or TEOS (tetraethoxysilane).

A contact hole 44 by which the p⁺ type body contact region 25 and the n⁺ type source region 24 of each of the unit cells 29 are exposed, a contact hole 45 by which the contact portion 40 of the gate electrode 27 is exposed, a contact hole 46 by which the p⁻ type contact layer 33 is exposed, and a contact hole 47 by which the equipotential ring electrode 41 is exposed are formed in the interlayer insulating film 43. These contact holes 44 to 47 are formed such that contact holes 44 to 47 pass through the interlayer insulating film 43 and through the gate insulating film 26.

The source electrode film 5 is made of aluminum or other metals. As shown in FIG. 3, the source electrode film 5 selectively covers a front surface of the interlayer insulating film 43 and is embedded in the contact hole 44. Consequently, the source electrode film 5 is ohmically connected to the n⁺ type source region 24. Therefore, the source electrode film 5 is connected to the plurality of unit cells 29 in parallel, and is arranged so that all electric currents flowing to the plurality of unit cells 29 flow thereto. Additionally, the source electrode film 5 is ohmically connected to the p⁺ type body contact region 25 of each of the unit cells 29 through the contact hole 44, so that the electric potential of the p type body region 22 is stabilized.

The gate electrode film 6 is made of aluminum or other metals. As shown in FIG. 3, the gate electrode film 6 is formed selectively covers the front surface of the interlayer insulating film 43 and is embedded in the contact hole 45. Consequently, the gate electrode film 6 is ohmically connected to the contact portion 40 of the gate electrode 27.

The outer peripheral electrode film 7 is made of aluminum or other metals. As shown in FIG. 3, the outer peripheral electrode film 7 selectively covers the front surface of the interlayer insulating film 43 and is embedded in the contact hole 46. Consequently, the outer peripheral electrode film 7 is ohmically connected to the p⁻ type contact layer 33.

The equipotential ring film 8 is made of aluminum or other metals. As shown in FIG. 3, the equipotential ring film 8 selectively covers the front surface of the interlayer insulating film 43 and is embedded in the contact hole 47. Consequently, the equipotential ring film 8 is ohmically connected to the equipotential ring electrode 41.

The surface protection film 48 is formed on a topmost surface of the semiconductor substrate 2 and covers the electrode films 5 to 8. The surface protection film 48 is made of an insulating material, such as a silicon nitride film or a polyimide film. As shown in FIG. 3, a pad opening 49 by which a part of the source electrode film 5 is exposed as the source pad 11 is formed in the surface protection film 48. A pad opening (not shown) by which a part of the gate electrode film 6 and a part of the outer peripheral electrode film 7 are exposed as the gate pad 12 and as the outer peripheral pad 17, respectively, is formed in the surface protection film 48. On the other hand, a finger part of the gate electrode film 6 and a finger part of the outer peripheral electrode film 7 (the gate finger 13 and the outer peripheral finger 18) are covered with the surface protection film 48. With respect to the equipotential ring film 8, its entirety is covered with the surface protection film 48.

The drain electrode 28 is made of aluminum or other metals. The drain electrode 28 is formed such that the drain electrode 28 is in contact with the rear surface of the n⁺ type drain layer 20. Consequently, the drain electrode 28 is connected to the plurality of unit cells 29 in parallel, and is arranged so that all electric currents flowing to the plurality of unit cells 29 flow thereto.

When a DC power source is connected between the source electrode film 5 and the drain electrode 28 in a state in which the drain electrode 28 is set as a high-potential side and in which the source electrode film 5 is set as a low-potential side, a reverse bias is applied to the parasitic diode 34. If a control voltage lower than a predetermined threshold voltage is applied to the gate electrode 27 at this time, no current path is formed between the drain and source sides. In other words, the semiconductor device 1 reaches an OFF state. On the other hand, if a control voltage greater than the threshold voltage is applied to the gate electrode 27, electrons are drawn to a front surface of the channel region 35, so that an inversion layer (channel) is formed. Consequently, the path between the n⁺ type source region 24 and the n⁻ type base layer 21 is brought into an electrically conductive state. In other words, a current path is formed from the source electrode film 5 to the drain electrode 28 through the n⁺ type source region 24, the inversion layer of the channel region 35, and the n⁻ type base layer 21 in this order. In other words, the semiconductor device 1 reaches an ON state.

When the semiconductor device 1 is applied to an inverter circuit that drives an inductive load, such as an electric motor, there is a case in which the source electrode film 5 becomes higher in potential than the drain electrode 28, and then the parasitic diode 34 is turned on, and an electric current flows through the parasitic diode 34. Thereafter, when the source electrode film 5 becomes lower in potential than the drain electrode 28, the parasitic diode 34 reaches a reverse bias state, and is turned off. When it is turned off, a depletion layer spreads from a pn junction portion of the parasitic diode 34, and carriers (positive holes) in the p type body region 22 and in the p⁻ type column layer 23 move to the source-electrode-film-5 side, and carriers (electrons) in the n⁻ type base layer 21 move to the drain-electrode-28 side.

Because of the movement of the carriers, an electric current flows in a direction opposite to a direction in which it flows when the parasitic diode 34 is in an ON state. This electric current is called a reverse recovery current. Generally, the reverse recovery current is temporarily increased and is then decreased. Time from when the forward current of the diode becomes zero until when the magnitude of the reverse recovery current decreases to 10% of its maximum value is called a reverse recovery time. When a change (dir/dt) in the reverse recovery current is large, there is a case in which oscillation (ringing) occurs until the electric current is settled to zero. This reverse recovery characteristic is called hard recovery, and causes noise or malfunctions.

In the present preferred embodiment, in the outer peripheral portion 4, the p⁻ type column layer 23 is connected to the outer peripheral electrode film 7 that is independent of the source electrode film 5. This makes it possible to allow an electric current to preferentially flow to the outer peripheral portion 4 by applying an appropriate voltage to the outer peripheral electrode film 7 when the semiconductor device 1 is turned off. It is possible to forcibly draw carriers (positive holes) existing in the p type column layer 23 to the outer peripheral portion 4, for example, by applying a negative bias to the outer peripheral electrode film 7. In other words, although a reverse current flows to the source-drain path of the active cell portion 3 by turning off the semiconductor device 1 if normal, it is possible to control a part of or all of the reverse current so as to flow to the outer peripheral portion 4. Furthermore, it is possible to forcibly draw the carriers to the outer peripheral portion 4, and therefore it is possible to satisfactorily control electric characteristics during the turn-off time even if the p⁻ type column layer 23 that is a moving path of the carriers is somewhat high in resistance. Therefore, in the active cell portion 3, it is possible to easily expand a depletion layer from the pn junction portion between the p⁻ type column layer 23 and the n⁻ type base layer 21 by making the impurity concentration of the p⁻ type column layer 23 lower than that of the p type body region 22 as mentioned above, and therefore it is also possible to improve withstand voltage.

As described above, in the present preferred embodiment, it is possible to distribute even more carriers moving through the n type base layer 21 in the outer peripheral portion 4 than in the active cell portion 3 when the semiconductor device 1 is turned off. Therefore, in the present preferred embodiment, the trap level region 38 is disposed in the outer peripheral portion 4. It is possible to facilitate a recombination of carriers in the outer peripheral portion 4 by means of the trap level region 38. As a result, it is possible to make the reverse recovery time trr shorter than before.

FIG. 4A to FIG. 4D are views showing a process of manufacturing the semiconductor device 1 in order of process steps. FIG. 4A to FIG. 4D correspond to the cross-sectional view of FIG. 3.

Figure 4A:
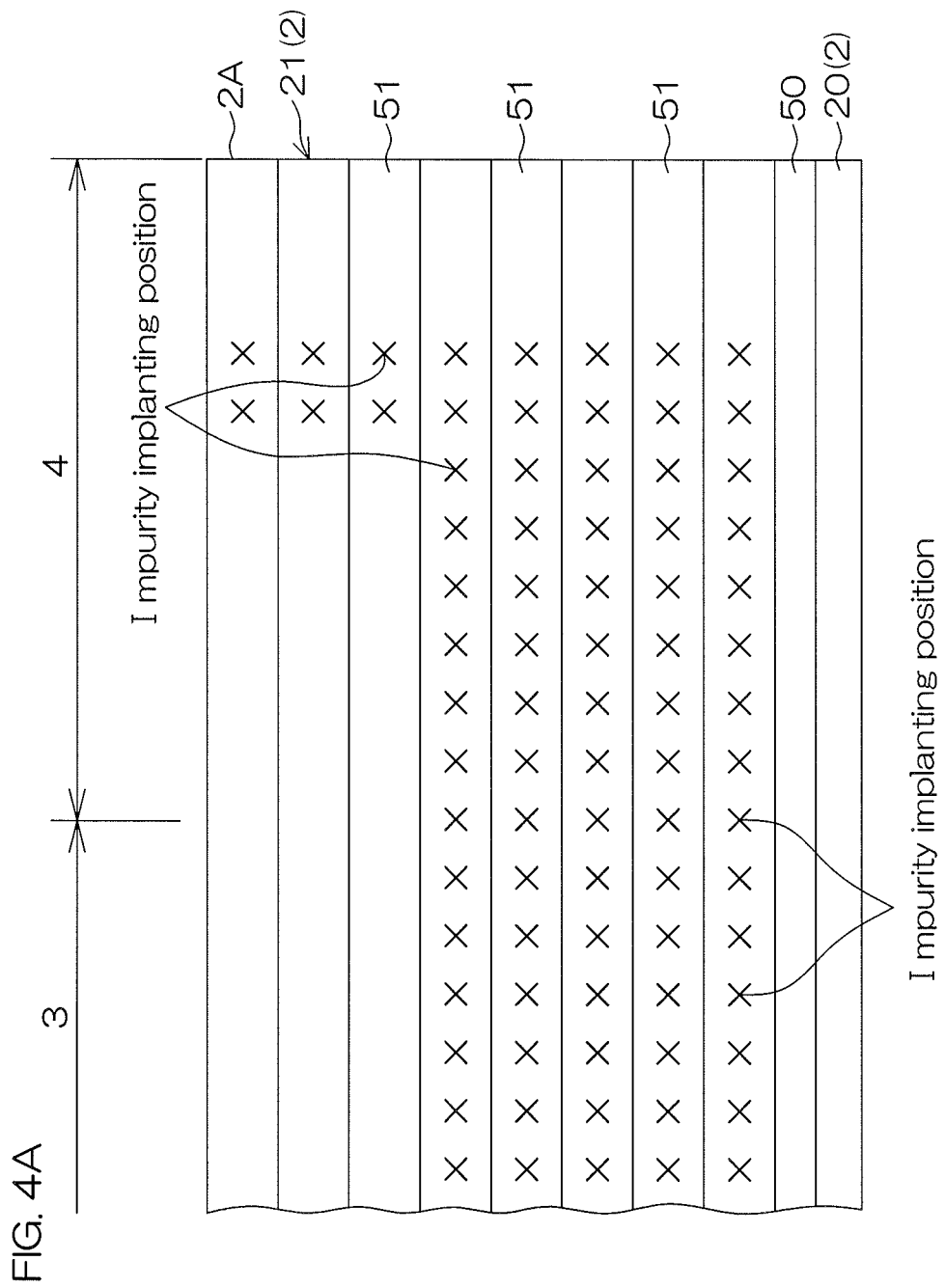

In order to manufacture the semiconductor device 53, an initial base layer 50 is first formed on the n⁺ type drain layer 20 as shown in FIG. 4A. Thereafter, a plurality of n type semiconductor layers 51 are stacked together on the initial base layer 50 by means of multi epitaxial growth to repeatedly perform a step of forming the n type semiconductor layer 51 while selectively implanting a p type impurity in positions in which the p⁻ type column layer 23 and the p⁻ type contact layer 33 are to be formed. Consequently, the plurality of n type semiconductor layers 51 and the initial base layer 50 are integrated with each other, so that the n⁻ type base layer 21 is formed.

Thereafter, the p type impurity of the plurality of n type semiconductor layers 51 is subjected to a drive diffusion by annealing (1000° C. to 1200° C.). Consequently, the p⁻ type column layer 23 and the p⁻ type contact layer 33 are simultaneously formed in the n type base layer 21 as shown in FIG. 4B.

Figure 4C:
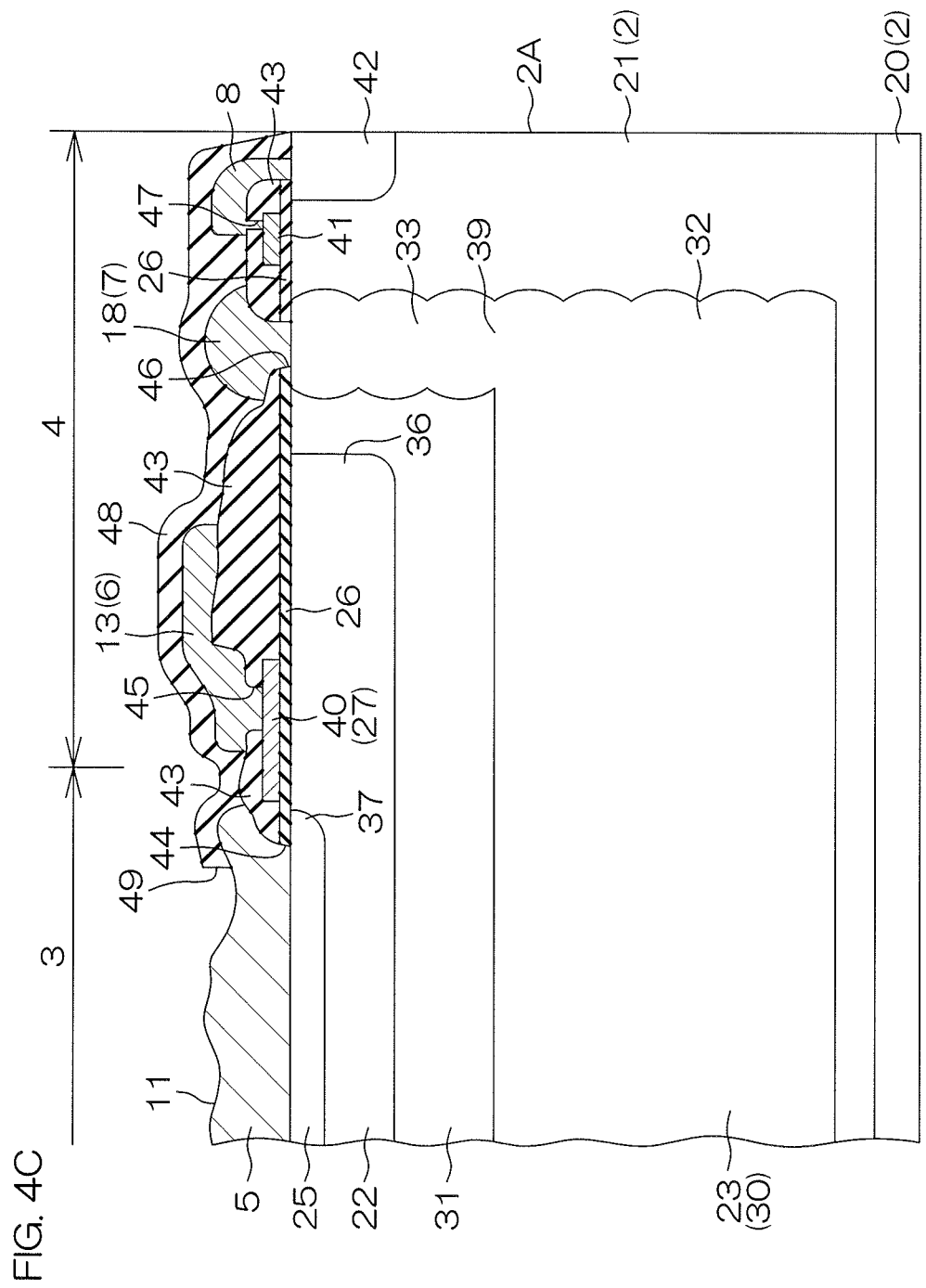

Thereafter, the p type body region 22 and the end-surface-side p type region 42 are formed by selectively implanting a p type impurity into the surface portion of the n⁻ type base layer 21 as shown in FIG. 4C. Thereafter, the n⁺ type source region 24 is formed by selectively implanting an n type impurity into the surface portion of the p type body region 22. Thereafter, the p⁺ type body contact region 25 is formed by selectively implanting a p type impurity into the surface portion of the p type body region 22.

Thereafter, the gate insulating film 26 is formed on the n⁻ type base layer 21 as shown in FIG. 4C. The gate insulating film 26 may be formed by the thermal oxidation of a semiconductor crystal surface. Furthermore, the gate electrode 27 and the equipotential ring electrode 41 are formed on the gate insulating film 26. The gate electrode 27 and the equipotential ring electrode 41 may be formed, for example, by forming a polysilicon film, resistance of which has been lowered by the addition of impurities, on the entire surface and then selectively etching the polysilicon film according to photolithography.

Furthermore, the interlayer insulating film 43 is formed so as to cover the gate electrode 27 and the equipotential ring electrode 41, and the contact holes 44 to 47 are formed in the interlayer insulating film 43 according to photolithography as shown in FIG. 4C. Thereafter, the source electrode film 5, the gate electrode film 6, the outer peripheral electrode film 7, and the equipotential ring film 8 are formed on the interlayer insulating film 43.

Thereafter, the surface protection film 48 is formed so as to cover the source electrode film 5, the gate electrode film 6, the outer peripheral electrode film 7, and the equipotential ring film 8, and the pad opening 49 is formed in the surface protection film 48 according to photolithography as shown in FIG. 4C. Thus, a MIS structure of the semiconductor device 1 is formed as shown in FIG. 4C.

Figure 4D:
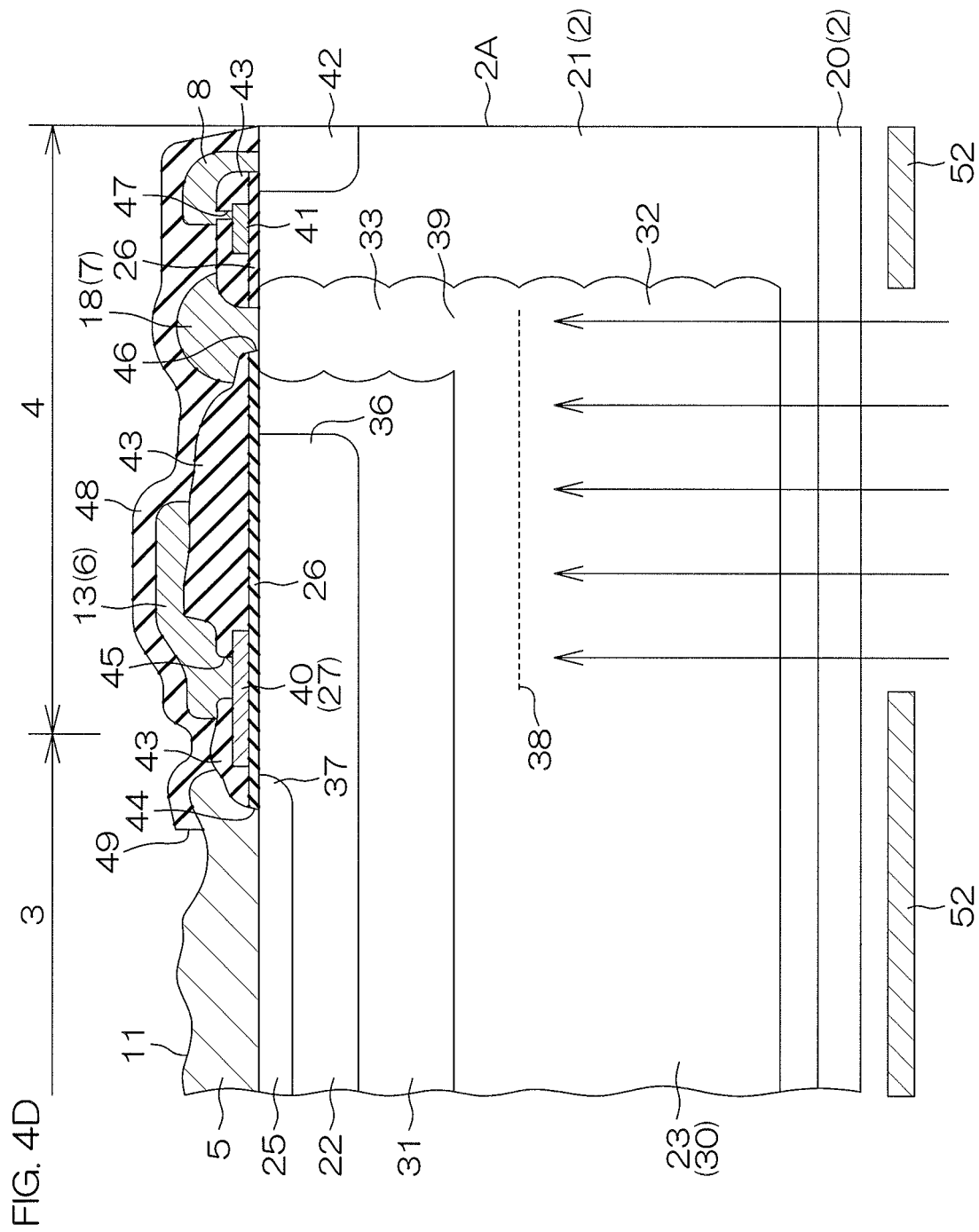

Thereafter, heavy-particle irradiation or electron-beam irradiation is performed from the rear surface of the n⁺ type drain layer 20 through a mask plate 52 as shown in FIG. 4D. It is recommended to appropriately determine the irradiation energy of the heavy particles or of the electron beams in consideration of the depth position of the trap level region 38. Consequently, the trap level region 38 is formed in the p⁻ type column layer 23.

Thereafter, the drain electrode 28 is formed on the rear surface of the n⁺ type drain layer 20, thus making it possible to obtain the semiconductor device 1 of FIG. 1 to FIG. 3.

Figure 5:
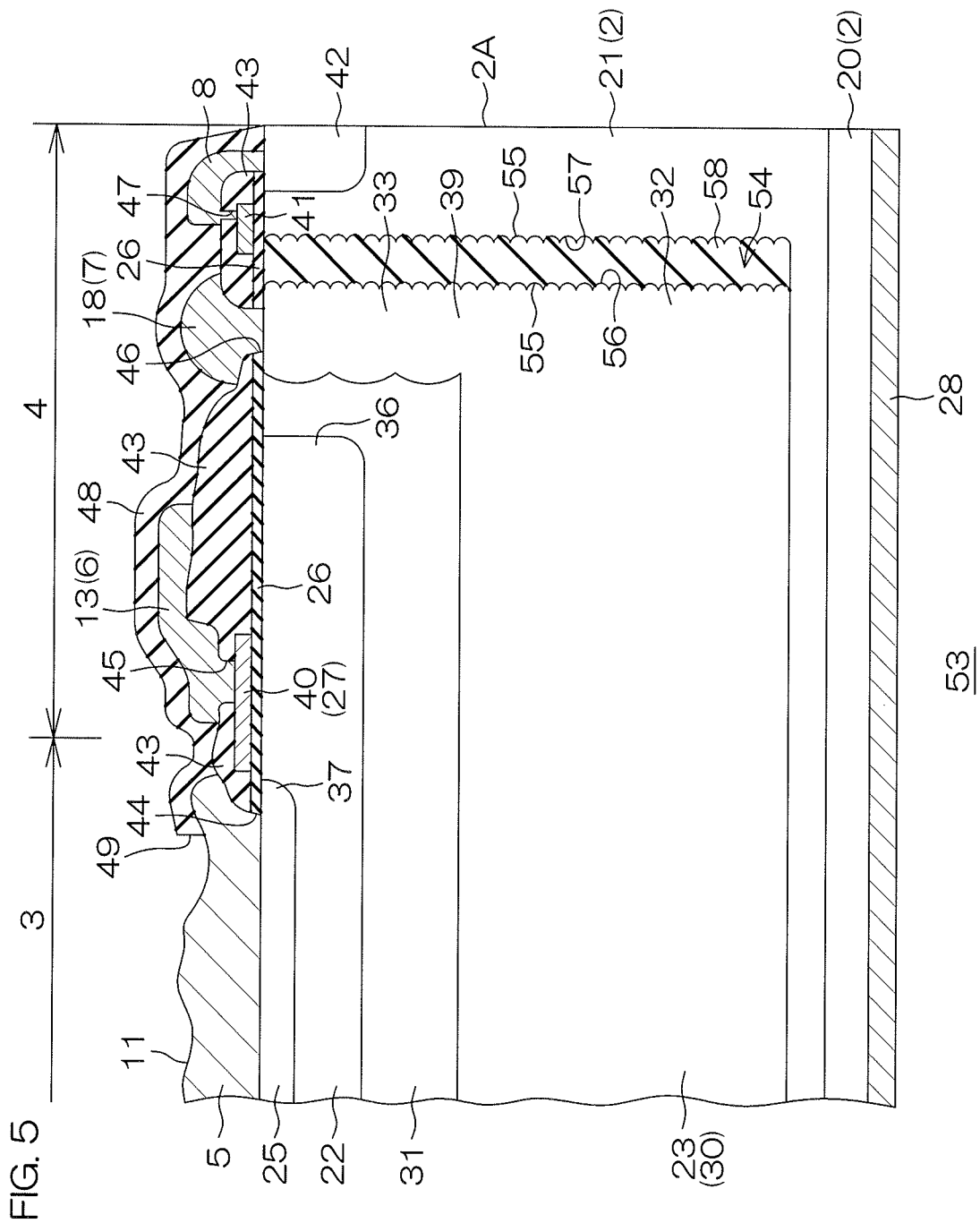
FIG. 5 is a schematic cross-sectional view of a semiconductor device according to a preferred embodiment of the present invention.

FIG. 5 is a schematic cross-sectional view of a semiconductor device 53 according to a preferred embodiment of the present invention. In FIG. 5, a description of each component that has already been described in the semiconductor device 1 of FIG. 1 to FIG. 3 is omitted by giving the same reference sign to the component.

The semiconductor device 53 of FIG. 5 has minute concavo-convex portions 55 formed on side surfaces 56 and 57 of a deep trench 54, respectively, instead of the trap level region 38 of the semiconductor device 1 mentioned above.

More specifically, the deep trench 54 is formed from the front surface of the n⁻ type base layer 21 toward the n⁺ type drain layer 20, and has, for example, a bottom portion at the same depth position as the bottom portion of the p type column layer 23. The p⁻ type contact layer 33 and the p⁻ type column layer 23 are exposed to the side surface 56 closer to the p⁻ type column layer 23 of the deep trench 54 over the whole area in the depth direction. The minute concavo-convex portion 55 is formed both on exposed parts of the p⁻ type contact layer 33 and of the p type column layer 23 and on the side surface 57 facing the exposed parts. The minute concavo-convex portion 55 is formed in a manner in which the side surfaces 56 and 57 of the deep trench 54 are roughened, and is formed extremely smaller than the concavo-convex surfaces (rugged surfaces) of the p⁻ type column layer 23 and of the p⁻ type contact layer 33.

The deep trench 54 has its inside the whole of which is filled with an embedded insulating film 58. The embedded insulating film 58 is made of an insulating material, such as a silicon oxide film.

According to the semiconductor device 53, in the carrier-moving path from the bottom portion of the p⁻ type column layer 23 to the outer peripheral electrode film 7 through the p⁻ type contact layer 33, the minute concavo-convex portion 55 is formed on the p⁻ type column layer 23 and the p⁻ type contact layer 33. Therefore, it is possible to allow the minute concavo-convex portion 55 to assume a role as a hole (electron) pocket, and it is possible to facilitate the disappearance of carriers that pass through the carrier-moving path. As a result, it is possible to make the reverse recovery time trr shorter than before.

FIG. 6A to FIG. 6E are views showing a manufacturing process of the semiconductor device 53 in order of process steps.

In order to manufacture the semiconductor device 1, an initial base layer 50 is first formed on the n⁺ type drain layer 20 as shown in FIG. 6A. Thereafter, a plurality of n type semiconductor layers 51 are stacked together on the initial base layer 50 by means of multi epitaxial growth to repeatedly perform a step of forming the n type semiconductor layer 51 while selectively implanting a p type impurity in positions in which the p type column layer 23 and the p type contact layer 33 are to be formed. Consequently, the plurality of n type semiconductor layers 51 and the initial base layer 50 are integrated with each other, so that the n⁻ type base layer 21 is formed.

Thereafter, the p type impurity of the plurality of n type semiconductor layers 51 is subjected to a drive diffusion by annealing (1000° C. to 1200° C.). Consequently, the p⁻ type column layer 23 and the p⁻ type contact layer 33 are simultaneously formed in the n type base layer 21 as shown in FIG. 6B.

Thereafter, a mask (not shown) that selectively has an opening in a region in which the deep trench 54 is to be formed is formed on the n⁻ type base layer 21, and the deep trench 54 is selectively formed in the n⁻ type base layer 21 by anisotropic deep RIE (Reactive Ion Etching) that uses the mask as a hard mask, i.e., by a Bosch process. In the Bosch process, for example, a step of etching the n⁻ type base layer 21 by use of $SF_6$ (sulfur hexafluoride) and a step of forming a protective film on an etched surface by use of $C_4F_8$ (perfluorocyclobutane) are alternately repeated. This makes it possible to etch the n type base layer 21 at a high aspect ratio, and makes it possible to form a wave-shaped concavo-convex portion (minute concavo-convex portion 55), which is called a scallop, on the etched surface (the side surfaces 56 and 57 of the deep trench 54) as shown in FIG. 6C.

Figure 6D:
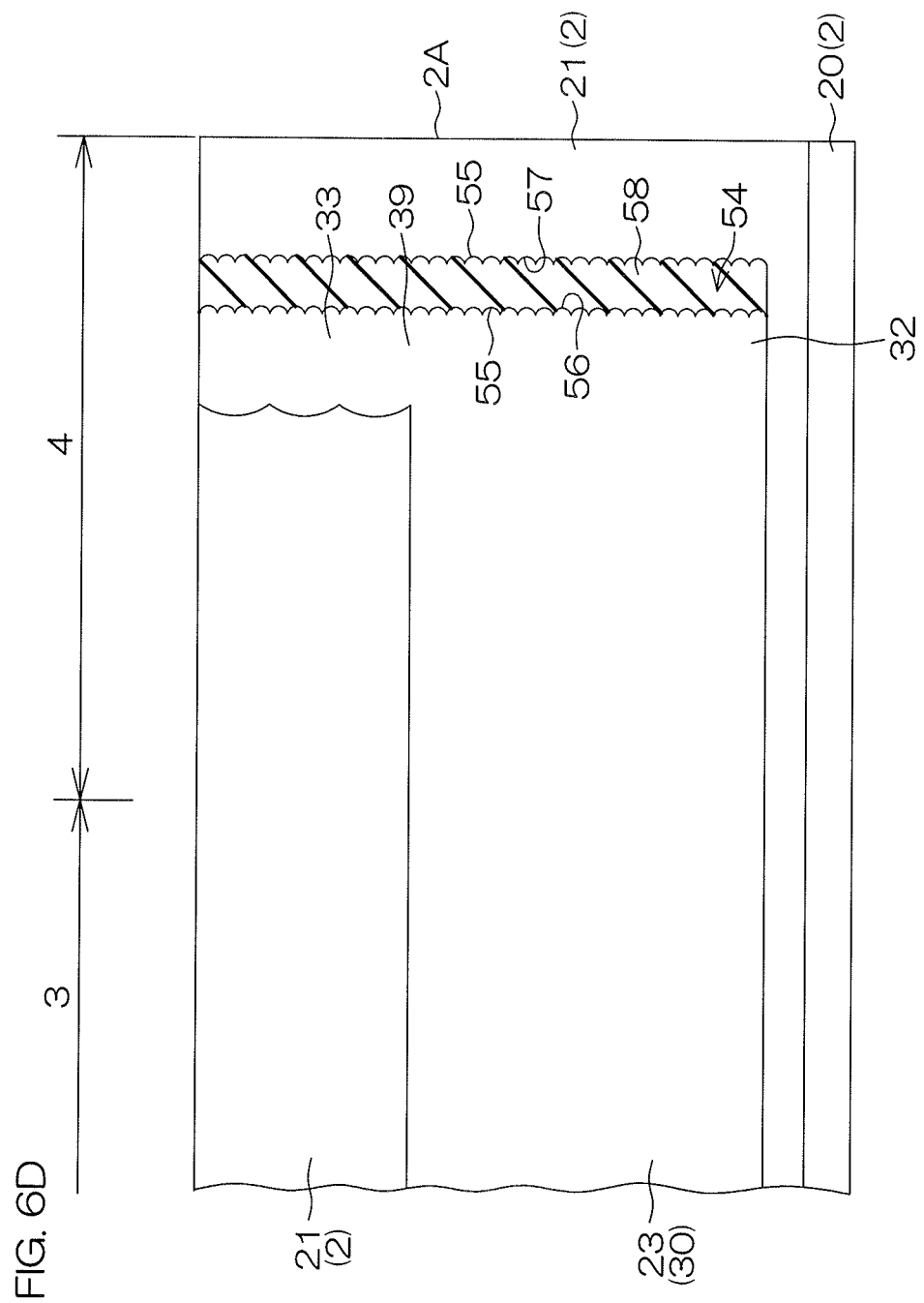

Thereafter, an insulating material is embedded in the deep trench 54 according to, for example, a CVD method as shown in FIG. 6D. Consequently, the embedded insulating film 58 is formed.

Figure 6E:
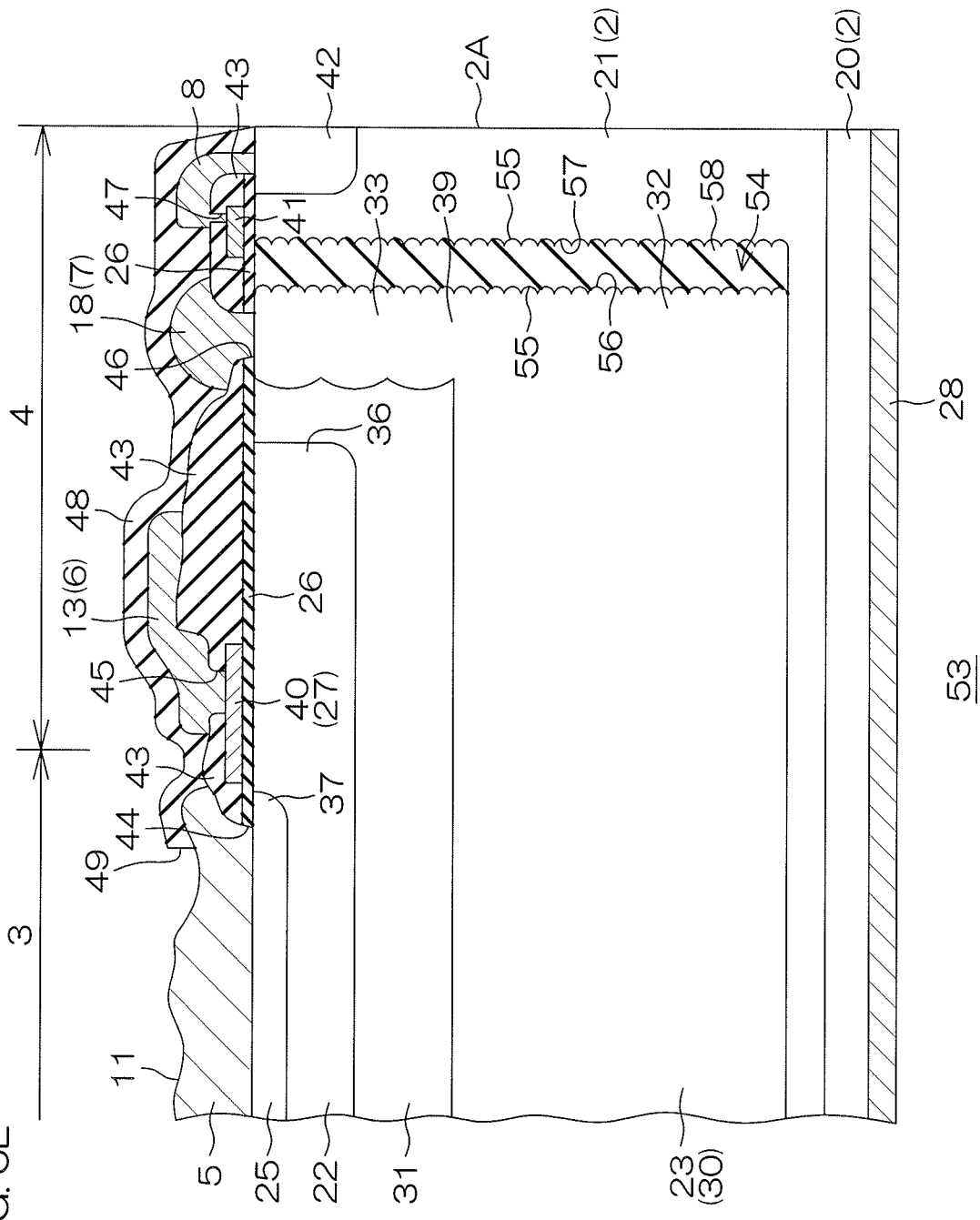

Thereafter, the p type body region 22 and the end-surface-side p type region 42 are formed by selectively implanting a p type impurity into the surface portion of the n⁻ type base layer 21 as shown in FIG. 6E. Thereafter, the n⁺ type source region 24 is formed by selectively implanting an n type impurity into the surface portion of the p type body region 22. Thereafter, the p⁺ type body contact region 25 is formed by selectively implanting a p type impurity into the surface portion of the p type body region 22.

Thereafter, the gate insulating film 26 is formed on the n type base layer 21 as shown in FIG. 6E. The gate insulating film 26 may be formed by the thermal oxidation of a semiconductor crystal surface. Furthermore, the gate electrode 27 and the equipotential ring electrode 41 are formed on the gate insulating film 26. The gate electrode 27 and the equipotential ring electrode 41 may be formed, for example, by forming a polysilicon film, resistance of which has been lowered by the addition of impurities, on the entire surface and then selectively etching the polysilicon film according to photolithography.

Furthermore, the interlayer insulating film 43 is formed so as to cover the gate electrode 27 and the equipotential ring electrode 41, and the contact holes 44 to 47 are formed in the interlayer insulating film 43 according to photolithography as shown in FIG. 6E. Thereafter, the source electrode film 5, the gate electrode film 6, the outer peripheral electrode film 7, and the equipotential ring film 8 are formed on the interlayer insulating film 43.

Thereafter, the surface protection film 48 is formed so as to cover the source electrode film 5, the gate electrode film 6, the outer peripheral electrode film 7, and the equipotential ring film 8, and the pad opening 49 is formed in the surface protection film 48 according to photolithography as shown in FIG. 6E. Thus, a MIS structure of the semiconductor device 53 is formed.

Thereafter, the drain electrode 28 is formed on the rear surface of the n⁺ type drain layer 20, thus making it possible to obtain the semiconductor device 53 of FIG. 5.

Figure 7:
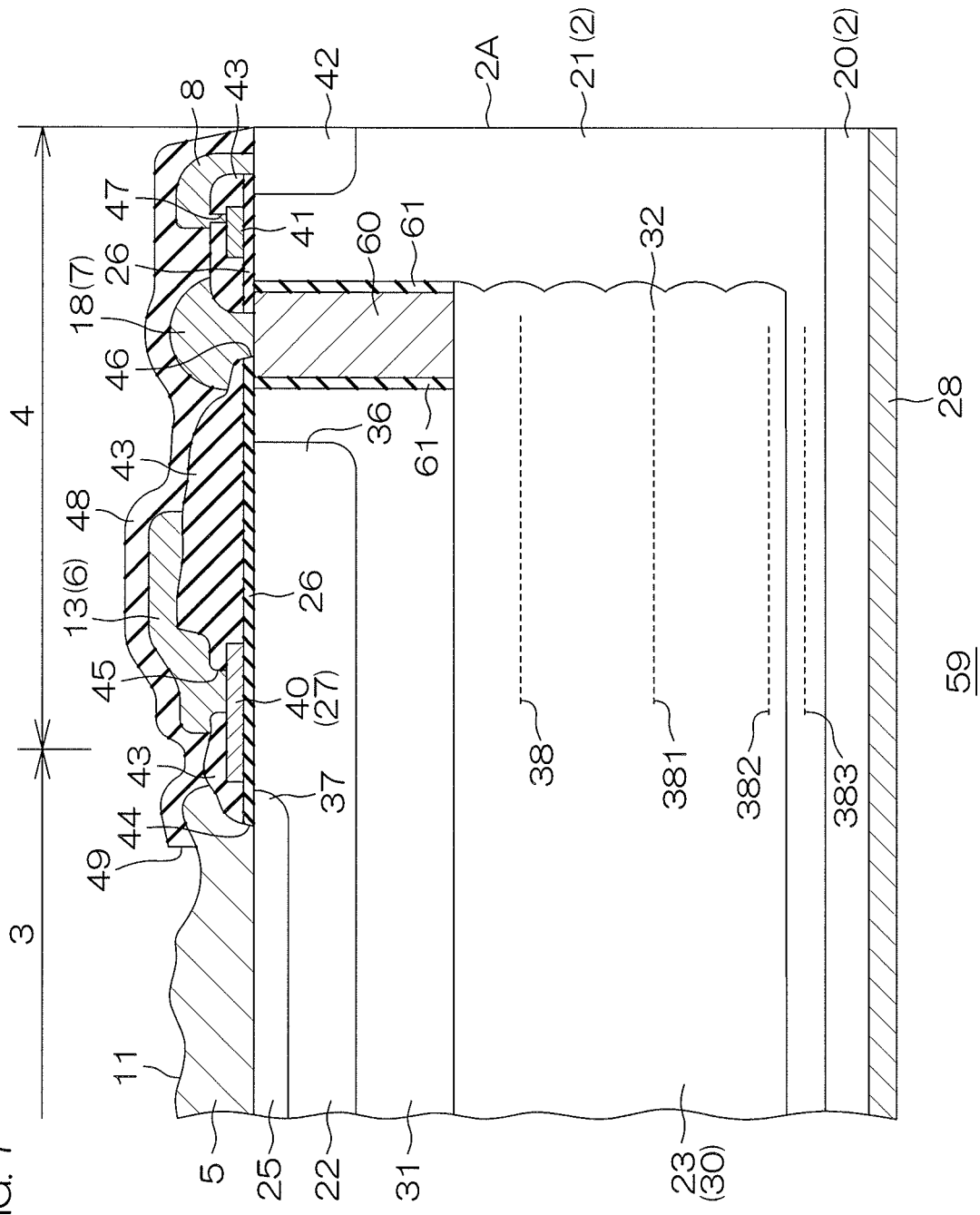
FIG. 7 is a schematic cross-sectional view of a semiconductor device according to a preferred embodiment of the present invention.

FIG. 7 is a schematic cross-sectional view of a semiconductor device 59 according to a preferred embodiment of the present invention.

The semiconductor device 59 of FIG. 7 includes an embedded contact member 60 that is embedded from the front surface of the n⁻ type base layer 21 to the p⁻ type column layer 23 and that is connected to the p⁻ type column layer 23, instead of the p type contact layer 33.

An insulating film 61 is interposed between the embedded contact member 60 and the n⁻ type base layer 21, and insulation between the embedded contact member 60 and the n⁻ type base layer 21 is made by the insulating film 61.

The outer peripheral electrode film 7 is connected to the embedded contact member 60 exposed to the front surface of the n⁻ type base layer 21.

The embedded contact member 60 is made of a metallic material excellent in embeddability, such as tungsten or copper. It is possible to excellently draw carriers (positive holes) existing in the p⁻ type column layer 23 to the outer peripheral portion 4 by using a metallic material that is low in resistance as a contact portion between the outer peripheral electrode film 7 and the p⁻ type column layer 23, unlike an impurity region such as the p⁻ type contact layer 33.

Although the preferred embodiments of the present invention have been described as above, the present invention can be embodied in other modes.

Figure 8:
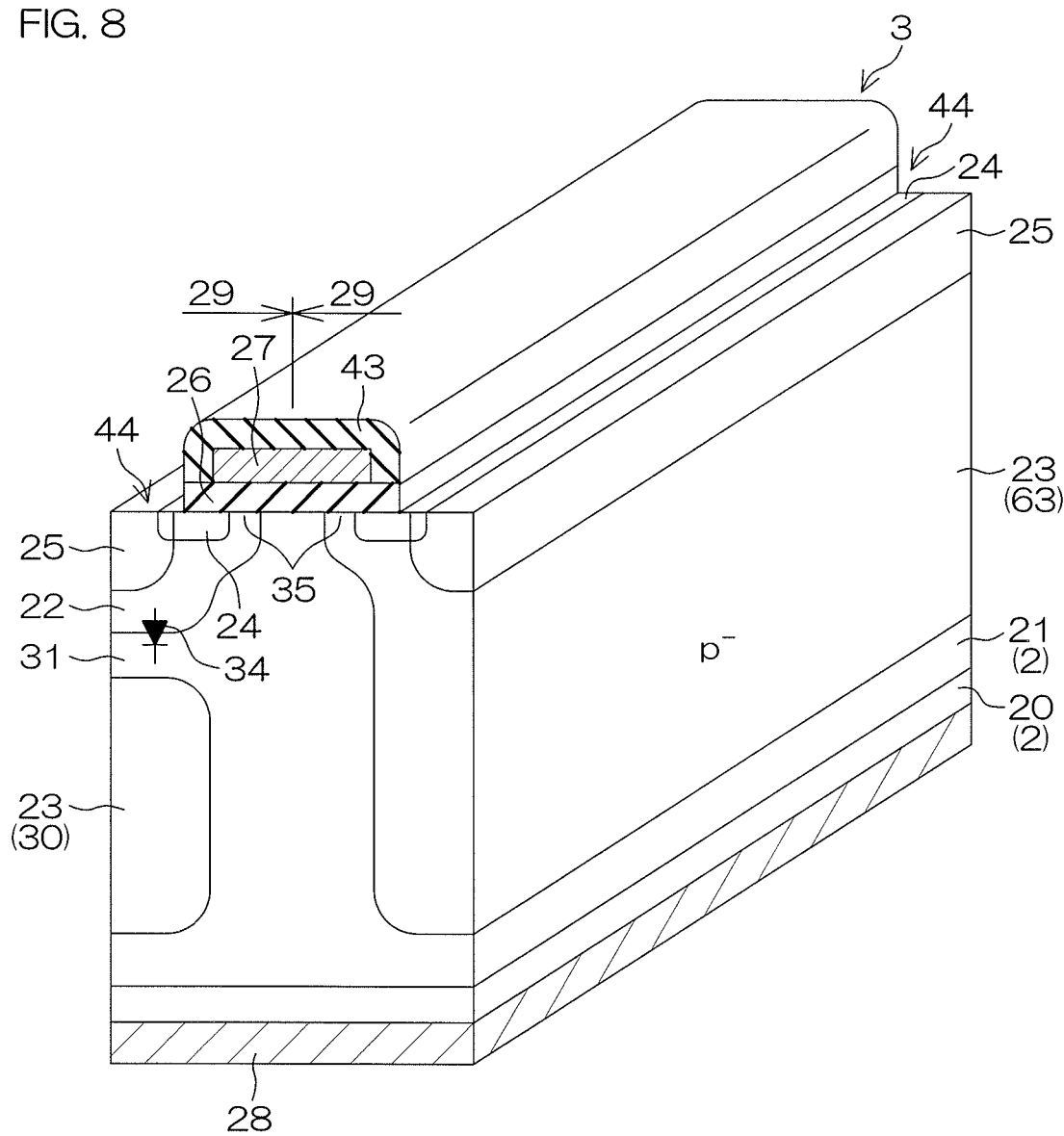
FIG. 8 is a schematic cross-sectional perspective view of a semiconductor device according to a preferred embodiment of the present invention.
Figure 9A:
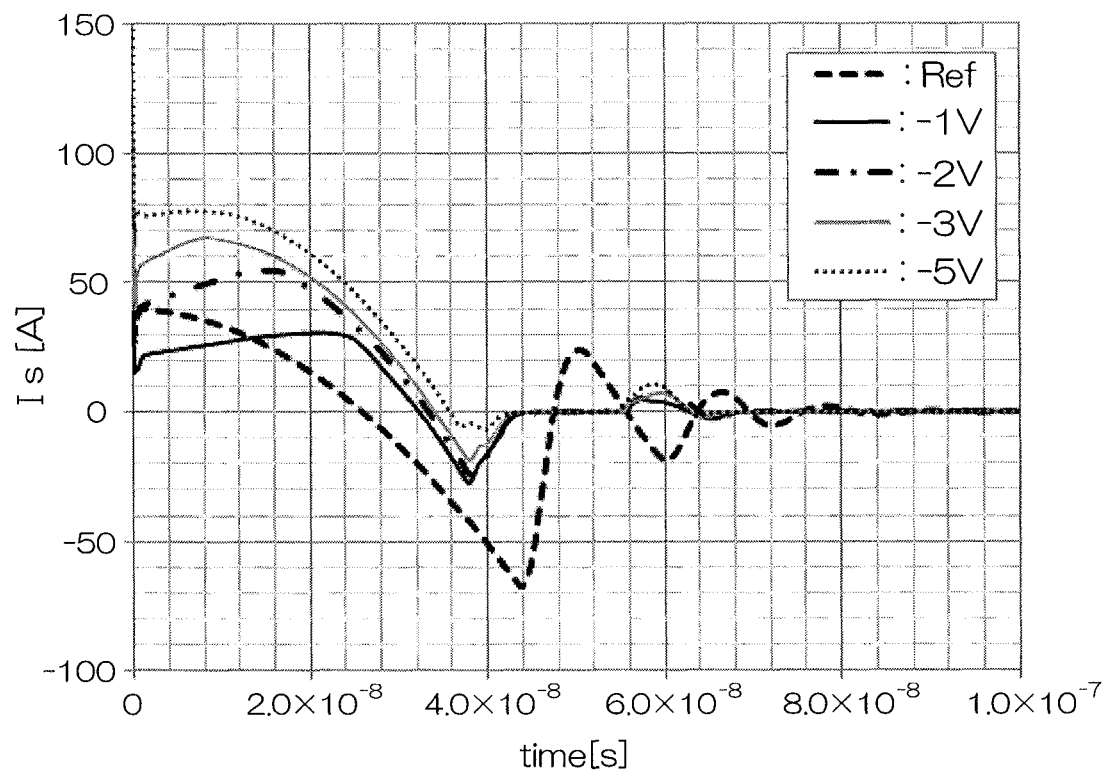
FIG. 9A and FIG. 9B are views that show current waveforms when the semiconductor device is turned off and that show current waveforms of an electric current flowing to a source region and current waveforms of an electric current flowing to a column layer, respectively.
Figure 9B:
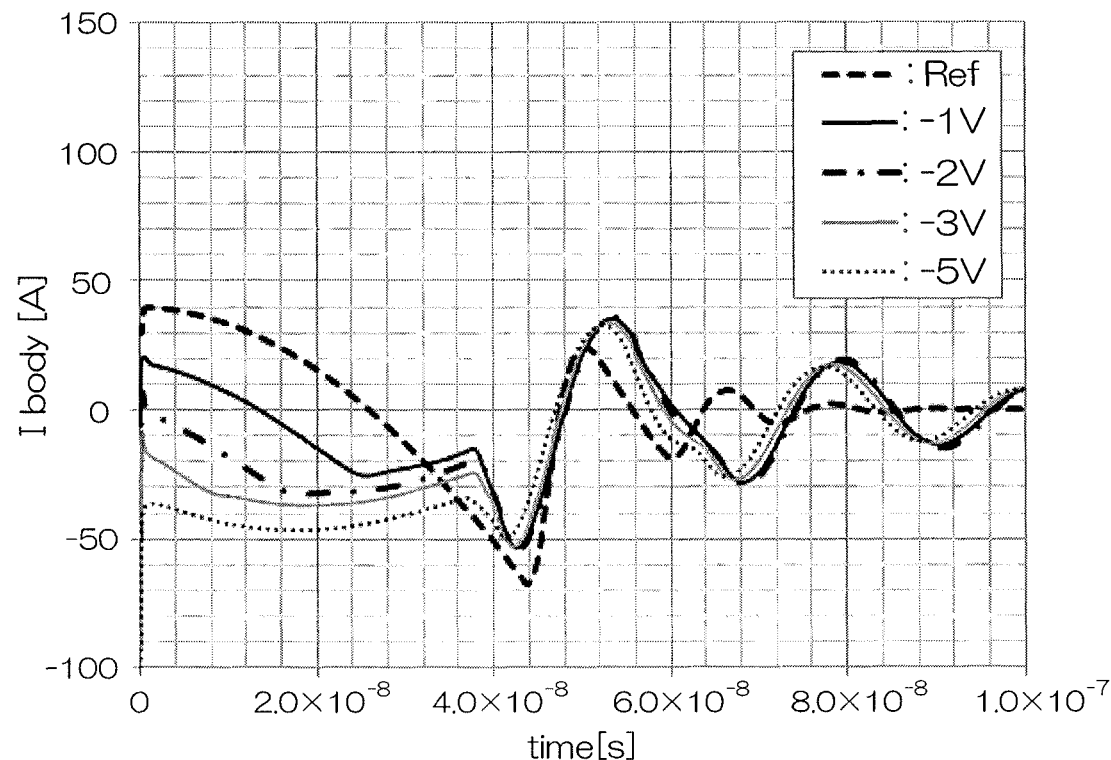
Figure 10A:
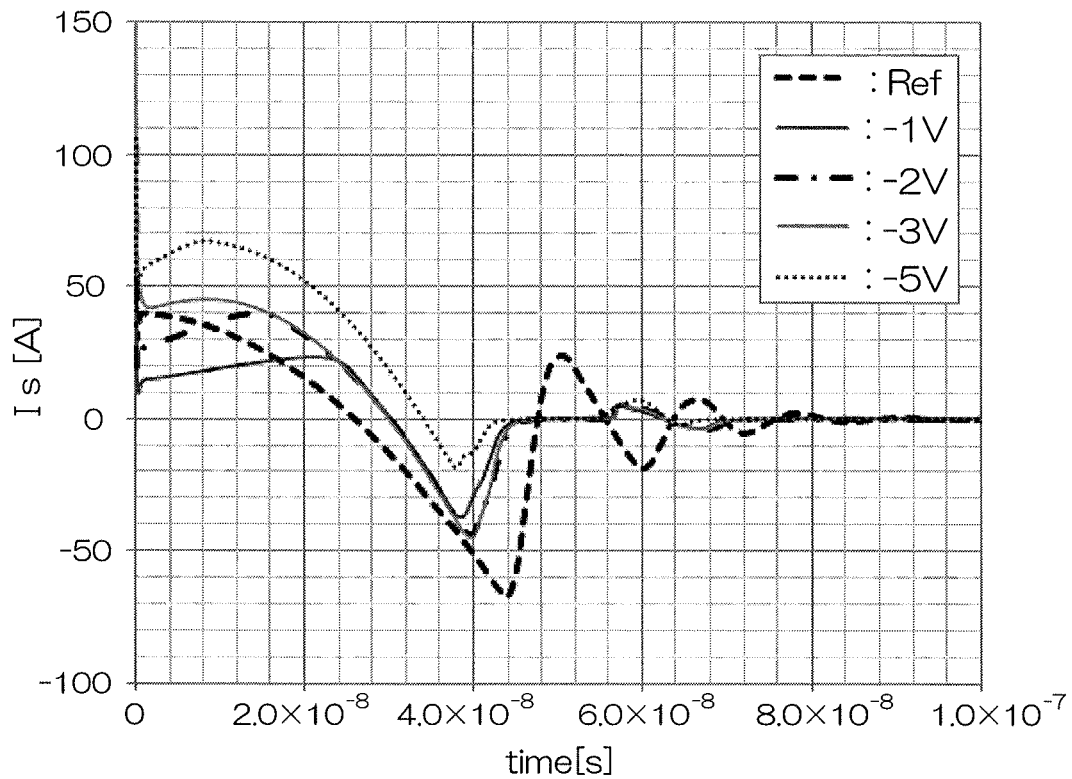
FIG. 10A and FIG. 10B are views that show current waveforms when the semiconductor device is turned off and that show current waveforms of an electric current flowing to a source region and current waveforms of an electric current flowing to a column layer, respectively.
Figure 10B:
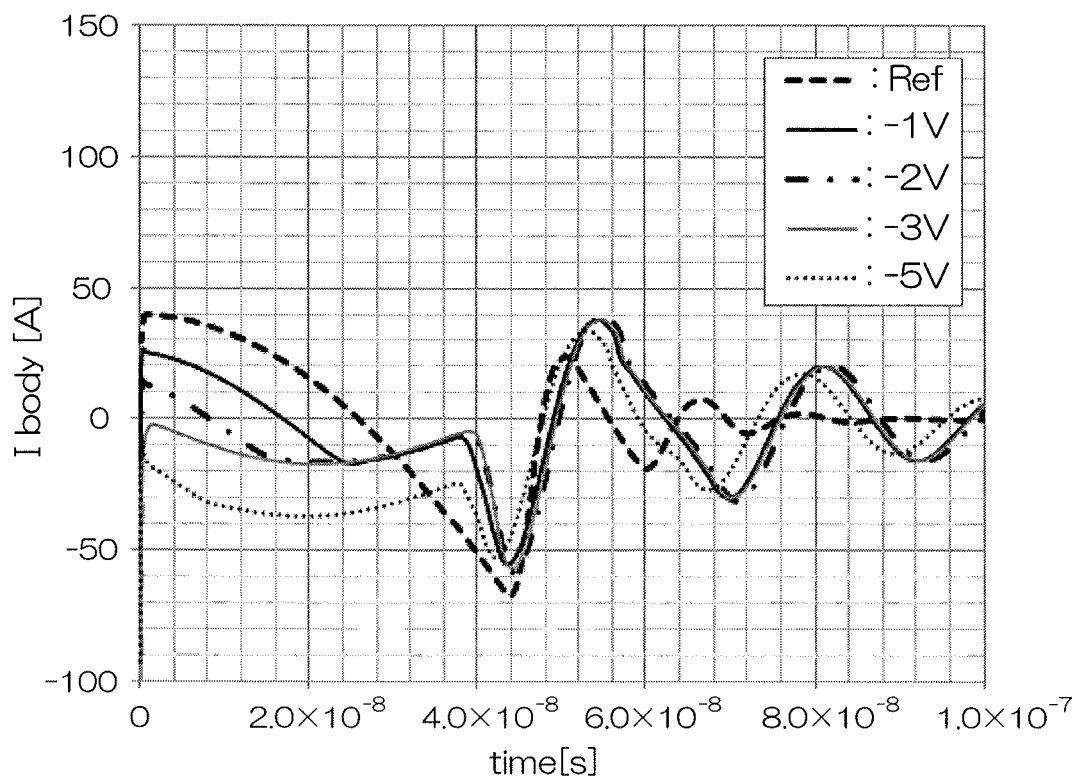
Figure 11A:
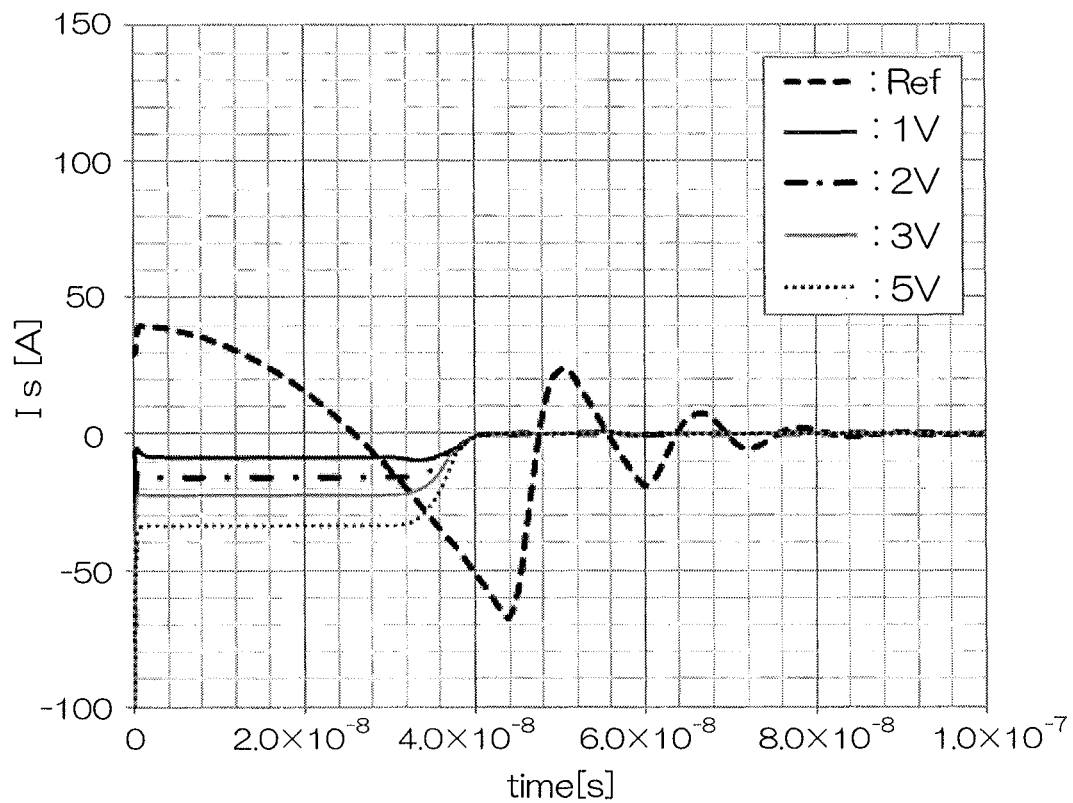
FIG. 11A and FIG. 11B are views that show current waveforms when the semiconductor device is turned off and that show current waveforms of an electric current flowing to a source region and current waveforms of an electric current flowing to a column layer, respectively.
Figure 11B:
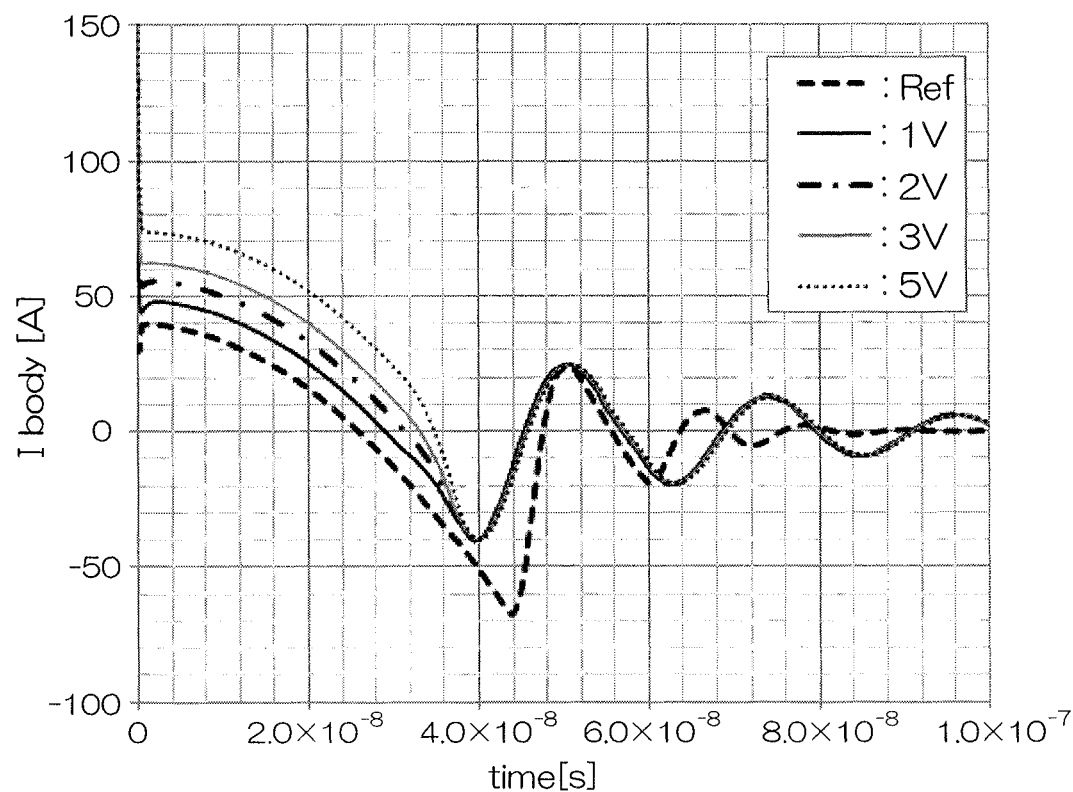
Figure 12A:
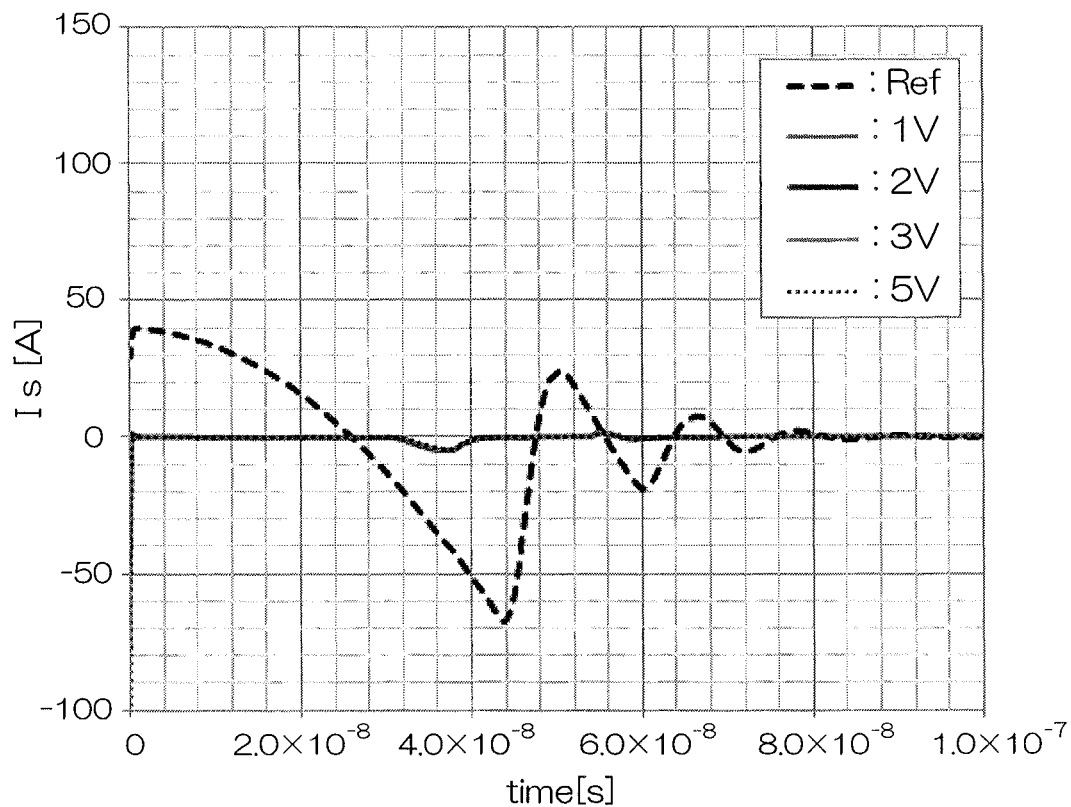
FIG. 12A and FIG. 12B are views that show current waveforms when the semiconductor device is turned off and that show current waveforms of an electric current flowing to a source region and current waveforms of an electric current flowing to a column layer, respectively.
Figure 12B:
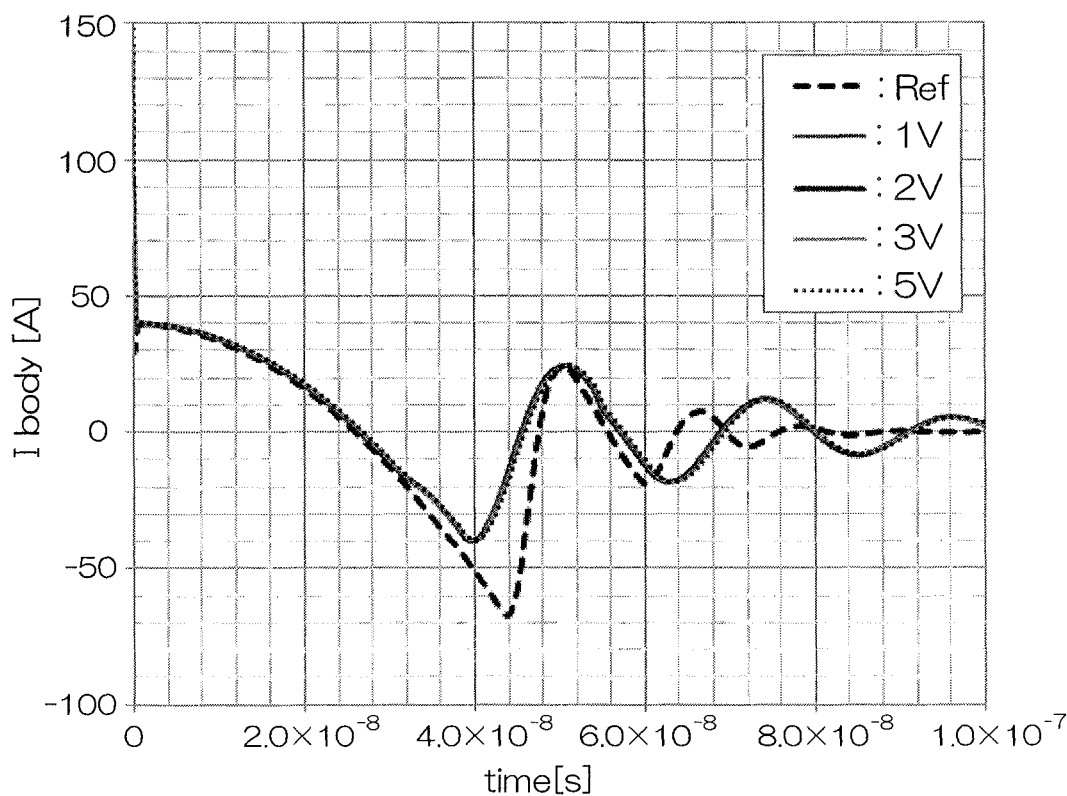

For example, as in a semiconductor device 62 of FIG. 8, the p⁻ type column layer 23 may include a continuous column 63 that is continuously formed downwardly from the p type body region 22 in the active cell portion 3. Although only one separated column 30 and only one continuous column 63 are shown in FIG. 8, the separated column 30 and the continuous column 63 may be alternately arranged, for example, in a direction perpendicular to the stripe direction.

Additionally, although the p⁻ type column layer 23 is formed by multi epitaxial growth as described in the above preferred embodiments, it is also possible to form the p⁻ type column layer 23, for example, by forming a deep trench in the n⁻ type base layer 21 and embedding a p⁻ type semiconductor layer in the deep trench.

Additionally, the structure of the unit cell 29 may be a planar gate structure or a trench gate structure as described in the above preferred embodiments.

Additionally, an arrangement may be employed in which the conductivity type of each semiconductor part of the semiconductor devices 1, 53, 59, and 62 is reversed. For example, in the semiconductor device 1, the p type part may be an n type part, and the n type part may be a p type part.

Besides, various design changes can be made within the scope of the subject matter described in the claims.

<Simulations>

Simulation results of FIG. 9A, FIG. 9B, FIG. 10A, FIG. 10B, FIG. 11A, FIG. 11B, FIG. 12A, and FIG. 12B show effects achieved by the application of a voltage to the outer peripheral electrode film 7 when the semiconductor devices 1, 53, 59, and 62 are turned off.

Of the figures mentioned above, figures for which "A" is given to the end of the figure number each show a current value of an electric current that flows to the source region of the semiconductor device when the semiconductor device is turned off. On the other hand, of the figures mentioned above, figures for which "B" is given to the end of the figure number each show a current value of an electric current that flows to the column layer of the semiconductor device when the semiconductor device is turned off. Additionally, FIG. 9A, FIG. 9B, FIG. 11A, and FIG. 11B show examples in which the continuous column 63 is used as the p type column layer 23, whereas FIG. 10A, FIG. 10B, FIG. 12A, and FIG. 12B show examples in which the separated column 30 is used as the p⁻ type column layer 23. In each simulation, an electrode embedded in the p⁻ type column layer 23 was set instead of the outer peripheral electrode film 7, and a voltage was applied to this electrode independently of the source electrode.

As a result of the simulations, in comparison between FIGS. 9A, 10A, 11A, 12A and FIGS. 9B, 10B, 11B, 12B, substantially the same amount of electric current flowed to the source region and to the column layer in "ref" for which a voltage was not applied to the embedded electrode (corresponding to the outer peripheral electrode film 7) of the p⁻ type column layer 23 when the semiconductor device is turned off. On the other hand, referring to examples in which the applied voltage is −1 V, −2 V, −3 V, −5 V, 1 V, 2 V, 3 V, and 5 V, an electric current flowing to the source region was reduced, and an electric current preferentially flowed to the column layer in any example.

From these results, it is clear that an electric current preferentially flows to the outer peripheral portion 4 of the n⁻ type base layer 21 in the above preferred embodiments. Therefore, it is understood that it is possible to settle an electric current flowing to the outer peripheral portion 4 and shorten the reverse recovery time trr by disposing a carrier obstructing portion, such as the trap level region 38 or the minute concavo-convex portion 55, at the outer peripheral portion 4.

Figure 13C:
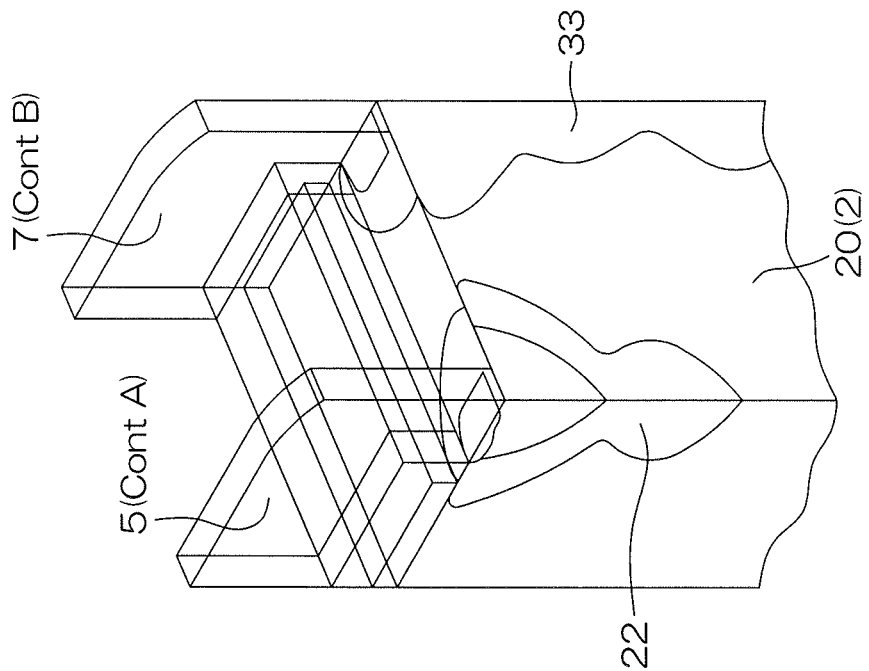
FIG. 13A to FIG. 13C are schematic views of a semiconductor device used in 3D simulations.
Figure 13B:
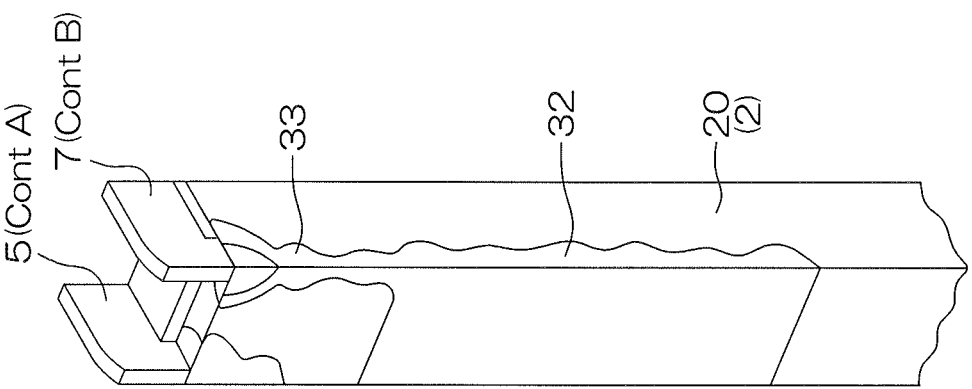
Figure 13A:
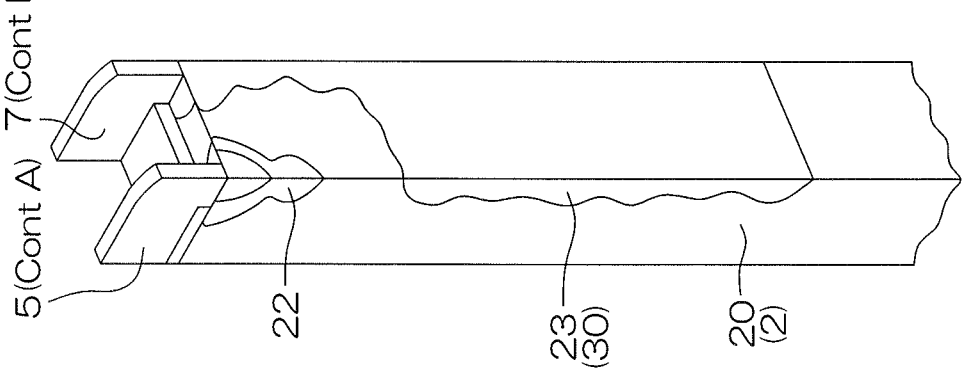

FIG. 13A to FIG. 13C are schematic views of the semiconductor device used in 3D simulations, and FIG. 13A and FIG. 13B are views when the semiconductor device is viewed from mutually different angles, and FIG. 13C is an enlarged view of a main part of FIG. 13A. In FIG. 13A to FIG. 13C, only reference signs necessary in the following description are shown among the reference signs of FIG. 2 and FIG. 3.

In 2D simulations whose results are shown in FIG. 9A to FIG. 12B mentioned above, the electrode embedded in the p type column layer 23 was set instead of the outer peripheral electrode film 7, and effects of the invention were verified. On the other hand, in the 3D simulations, a contact A (ContA) corresponding to the source electrode film 5 and a contact B (ContB) corresponding to the outer peripheral electrode film 7 were set as shown in FIG. 13A to FIG. 13C, and effects were verified under conditions closer to the structure of each preferred embodiment mentioned above. ContA is set in an electrically floating state, and ContB is connected to +5 V.

In the simulations, a reverse voltage of 600 V was applied to the source-drain path in a state in which an electric current of 20 A flows to the source-drain path, and the semiconductor device was turned off. Thereafter, waveforms were verified until the electric current flowing to ContA and to ContB was settled. Results are shown in FIG. 14.

Figure 14:
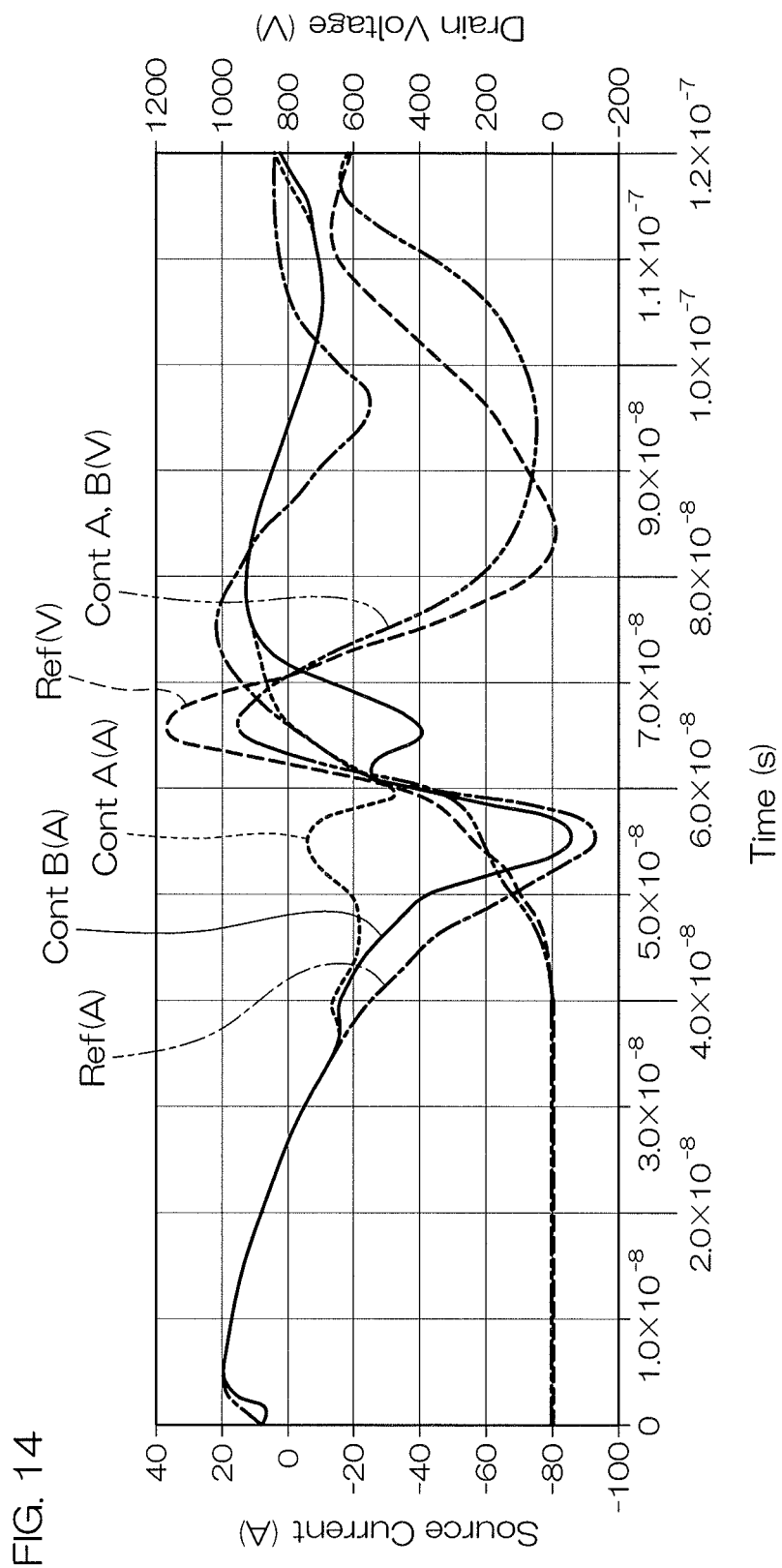
FIG. 14 is a view showing waveforms of results of the 3D simulations.

As a result of the simulations, in comparison between the electric current ("ContA (A)" of FIG. 14) flowing to ContA and the electric current ("ContB (A)" of FIG. 14) flowing to ContB, the electric current flowing to ContA on the source side was small in amount, whereas the electric current preferentially flowed to ContB on the column side. Additionally, it has been recognized that the reverse recovery currents flowing to ContA and ContB are both smaller than a Ref current (A) in which the column layer is not separated. Additionally, with respect to the voltage ("ContA, B (V)" of FIG. 14) between the source and the drain, a change in the electric current becomes gentle due to the divided flow effect to ContA and to ContB, and it is possible to suppress the oscillation to be smaller than the Ref voltage (V).

The invention claimed is:

1. A semiconductor device comprising:
a first conductivity type semiconductor layer including an active cell portion and an outer peripheral portion around the active cell portion;
a second conductivity type body region selectively formed at a surface portion of the semiconductor layer in the active cell portion;
a first conductivity type source region formed at an inner part of the body region;
a gate electrode that faces a part of the body region through a gate insulating film, the gate electrode including a gate finger;
a second conductivity type column layer extending from the active cell portion to the outer peripheral portion inside the semiconductor layer such that the column layer is disposed at a lower part of the body region in the active cell portion;
a source electrode that is electrically connected to the source region, the source electrode being surrounded by the gate finger; and
an outer peripheral electrode that is electrically connected to the column layer in the outer peripheral portion, the outer peripheral electrode surrounding the gate finger and the outer peripheral electrode being electrically separated from both the gate electrode and the source electrode.

2. The semiconductor device according to claim 1, further comprising a carrier obstructing portion being in contact with the column layer in the outer peripheral portion, the carrier obstructing portion capable of trapping and reducing carriers in the column layer.

3. The semiconductor device according to claim 2, wherein the carrier obstructing portion includes a trap level region disposed in the semiconductor layer.

4. The semiconductor device according to claim 3, wherein the trap level region includes heavy particles that include any one of protons, $^3\text{He}^{++}$, and $^4\text{He}^{++}$.

5. The semiconductor device according to claim 2, further comprising a deep trench that is formed adjacently to the column layer and that has a side surface from which the column layer is exposed,
wherein the carrier obstructing portion includes a minute concavo-convex portion formed at an exposed part of the column layer in the side surface of the deep trench.

6. The semiconductor device according to claim 5, further comprising an embedded insulating film that is formed in the deep trench.

7. The semiconductor device according to claim 1, wherein the column layer includes a separated column separated from the body region in the active cell portion.

8. The semiconductor device according to claim 1, wherein the column layer includes a continuous column that is continuously formed with the body region in the active cell portion.

9. The semiconductor device according to claim 1, wherein the body region includes a plurality of body regions that extend in a stripe shape with intervals from each other.

10. The semiconductor device according to claim 1, further comprising a contact layer that extends from the column layer toward a front surface side of the semiconductor layer in the outer peripheral portion and that is formed of a semiconductor impurity region exposed to a front surface of the semiconductor layer,
wherein the outer peripheral electrode is connected to the contact layer in the front surface of the semiconductor layer.

11. The semiconductor device according to claim 1, further comprising an embedded contact member that is embedded from a front surface of the semiconductor layer to a depth position below the body region in the outer peripheral portion and that is connected to the column layer at the depth position,
wherein the outer peripheral electrode is connected to the embedded contact member in the front surface of the semiconductor layer.

12. The semiconductor device according to claim 1, wherein the semiconductor layer includes a silicon substrate.

* * * * *